United States Patent
Chen et al.

(10) Patent No.: US 7,457,491 B2
(45) Date of Patent: Nov. 25, 2008

(54) SYSTEM, METHOD AND APPARATUS FOR IMPROVED ELECTRICAL-TO-OPTICAL TRANSMITTERS DISPOSED WITHIN PRINTED CIRCUIT BOARDS

(75) Inventors: Ray T. Chen, Austin, TX (US); Chulchae Chol, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 11/524,576

(22) Filed: Sep. 21, 2006

(65) Prior Publication Data

US 2007/0013061 A1    Jan. 18, 2007

Related U.S. Application Data

(62) Division of application No. 10/888,350, filed on Jul. 7, 2004, now Pat. No. 7,112,885.

(60) Provisional application No. 60/485,496, filed on Jul. 7, 2003.

(51) Int. Cl.
*G02B 6/30* (2006.01)
*G02B 6/42* (2006.01)

(52) U.S. Cl. .............................. 385/14; 385/42; 385/44; 385/49; 385/50; 385/88; 438/27; 438/29; 438/41; 257/722; 257/726; 257/728; 257/E23.01; 257/E23.101

(58) Field of Classification Search .................. 257/722, 257/726, 728; 385/10, 50, 88; 438/27, 29, 438/41
See application file for complete search history.

(56) References Cited

U.S. PATENT DOCUMENTS

| 4,732,446 | A | 3/1988 | Gipson et al. |
| 4,772,787 | A | 9/1988 | Trommer |
| 4,966,430 | A | 10/1990 | Weidel |

(Continued)

OTHER PUBLICATIONS

Ray T. Chen, Lei Lin, Chulchae Choi, Yujie J. Liu, Bipin Bihari, L. Wu, Suning Tang, R. Wickman, B. Picor, M. K. Hibbs-Brenner. J. Bristow and Y. S. Liu, "Fully Embedded Board Level Guided Wave Optoelectronic Interconnects", Jun. 2002, Proc. of the IEEE, vol. 88, No. 6, pp. 780-793.

(Continued)

*Primary Examiner*—Dao H Nguyen
(74) *Attorney, Agent, or Firm*—Chalker Flores, LLP; Daniel J. Chalker; Edwin Flores

(57) ABSTRACT

The present invention provides a system, method and apparatus for improved electrical-to-optical transmitters (100) disposed within printed circuit boards (104). The heat sink (110, 200) is a thermal conductive material disposed within a cavity (102) of the printed circuit board (104) and is thermally coupled to a bottom surface (112) of the electrical-to-optical transmitter (100). A portion of the thermal conductive material extends approximately to an outer surface (120, 122 or 124) of a layer (114, 116 or 118) of the printed circuit board (104). The printed circuit board may comprise a planarized signal communications system or an optoelectronic signal communications system. In addition, the present invention provides a method for fabricating the heat sink wherein the electrical-to-optical transmitter disposed within a cavity of the printed circuit board is fabricated. New methods for flexible waveguides and micro-mirror couplers are also provided.

20 Claims, 15 Drawing Sheets

U.S. PATENT DOCUMENTS

| | | | |
|---|---|---|---|
| 5,170,448 | A | 12/1992 | Ackley et al. |
| 5,357,122 | A | 10/1994 | Okubora et al. |
| 5,400,419 | A | 3/1995 | Heinen |
| 5,654,228 | A | 8/1997 | Shieh et al. |
| 6,097,748 | A | 8/2000 | Huang et al. |
| 6,243,509 | B1 | 6/2001 | Chen |
| 6,696,755 | B2 | 2/2004 | Kami et al. |
| 6,785,447 | B2 * | 8/2004 | Yoshimura et al. ............ 385/42 |
| 6,845,184 | B1 | 1/2005 | Yoshimura et al. |
| 2002/0191656 | A1 | 12/2002 | Mawst et al. |
| 2003/0223697 | A1 * | 12/2003 | Simon ......................... 385/49 |
| 2004/0037512 | A1 * | 2/2004 | Cho et al. ..................... 385/88 |
| 2004/0202210 | A1 | 10/2004 | Thornton |
| 2004/0202218 | A1 | 10/2004 | Thornton |

OTHER PUBLICATIONS

Chulchae Choi, Lei Lin, Yujie Liu and Ray T. Chen, "Performance Analysis of 10-μm- Thick VCSEL Array in Fully Embedded Board Level Guided-Wave Optoelectronic Interconnects", Oct. 2002, IEEE pp. 1531-1535.

H. Fathollahnejad, D. L. Mathine, R. Droopad, G. N. Maracas, and S. Daryanani, "Vertical-cavity surface emitting lasers integrated onto silicon substrates by PdGe contacts", Jul. 1994, Electron. Lett., vol. 30 No. 15.

Detlef Krabe, Frank Ebling, Norbert Amdt-Staufenbiel, Günter Lang and Wolfgang Scheel, "Electrical/Optical Circuit Board Built for SMT Manufacturing", Electronic Packaging and Production, pp. 38-47. Jul. 2000.

Yung-Cheng Lee, Stanley E. Swirhun, Winston S. Fu, Tim A. Keyser, Jaack L. Jewell, and William E. Quinn, "Thermal management of VCSEL-Based Optoelectronic Modules", Aug. 1999, IEEE Trans. On Comp, Packaging and Manufacturing Technol. vol. 19(3), pp. 540-547.

Chao-Kun Lin, Sang-Wan Ryu, and P. Daniel Dapkus, "High Performance Wafer-Bonded Bottom-Emitting 850nm VCSEL's on Undoped GaP and Saphire Substrates", Dec. 1999, IEEE Photon. Technol. Lett., vol. 11, No. 12.

B. Lunitz, J. Guttmann, H. P. Huber, J. Moisel and M. Rode, "Experimental Demonstration of 2.5GBit/s transmission with 1m polymer optical backplane", 2001, Electron. Lett., vol. 37, No. 17.

F. Mederer, R. Jäger, H. J. Unold, R. Michalzik, K. J. Ebeling, S. Lehmacher, A. Neyer, and E. Griese, "3-Gb/s Data Transmission With GaAs VCSEL's Over PCB Integrated Polymer Waveguides", IEEE Photon. Technol. Lett. 2001, vol. 13, No. 9. Sep.

J. Piprek, T. Tröger, B. Schröter, J. Kolodzey and C. S. Ih, "Thermal Conductivity Reduction in GaAs-AlAs Distributed Bragg Reflectors", Jan. 1998, IEEE Photon. Technol. Lett., vol. 10, No. 1.

Rui Pu, Carl W. Wilmsen, Kent M. Geib, and Kent D. Choquette, "Thermal Resistance of VCSEL's Bonded to Integrated Circuits", IEEE Photon. 1999, Technol. Lett., vol. 11, No. 12, pp. 1554-1556.

T. Yao, "Thermal Properties of AlaS/gaAs superlattices", 1987, Appl. Phys. Lett., vol. 51, pp. 1798-1800.

* cited by examiner

SYSTEM, METHOD AND APPARATUS FOR IMPROVED ELECTRICAL-TO-OPTICAL TRANSMITTERS DISPOSED WITHIN PRINTED CIRCUIT BOARDS

This patent application is a divisional patent application of U.S. patent application Ser. No. 10/888,350 filed on Jul. 7, 2004, which is a U.S. non-provisional patent application of U.S. provisional patent application Ser. No. 60/485,496 filed on Jul. 7, 2003.

PRIORITY CLAIM AND U.S. GOVERNMENT GRANTS

This work was sponsored by United States Government grants from DARPA (No. MDA972-00-1-0024).

FIELD OF THE INVENTION

The present invention relates generally to the field of optoelectronic systems, and in particular, to a system, method and apparatus for improved electrical-to-optical transmitters disposed within printed circuit boards.

BACKGROUND OF THE INVENTION

Printed circuit boards ("PCBs"), multi-chip modules ("MCMs"), and similar structures having multiple integrated circuits mounted upon their surfaces are used extensively in modern electronic devices and systems. PCBs typically contain multiple conductive and dielectric layers interposed upon each other, and interlayer conductive paths (referred to as vias), which may extend from an integrated circuit mounted on a surface of the PCB to one or more conductive layers embedded within the PCB. MCMs decrease the surface area by removing package walls between chips, improve signal integrity by shortening interconnection distances and remove impedance problems and capacitances. MCMs and other similar structures typically have similar configuration and structure (e.g., a substrate comprising dielectric and conductive layers having interlayer vias). For ease of reference, all such structures shall hereafter be referred to as "boards".

The speed and complexity of integrated circuits are increasing rapidly as integrated circuit technology advances from very large scale integrated ("VLSI") circuits to ultra large scale integrated ("ULSI") circuits. As the number of components per chip, the number of chips per board, the modulation speed and the degree of integration continue to increase, electrical interconnects are facing fundamental limitations in areas such as speed, packaging, fan-out, and power dissipation. MCM technology has been employed to provide higher data transfer rates and circuit densities. Conventional technologies based on electrical interconnects, however, fail to provide requisite multi-Gbits/sec clock speed in intra-MCM and inter-MCM applications.

Additionally, a printed circuit board may, in some instances, be quite large and the conductive paths therein can be several centimeters in length. As conductive path lengths increase, impedances associated with those paths also increase. This has a detrimental effect on the ability of the system to transmit high speed signals. Although the use of copper and materials with lower dielectric constant materials can release the bottleneck in a chip level for the next several years, these materials will not support interconnection speed over a few GHz even though chip local clock speeds are expected to constantly increase to 10 GHz by the year 2011. It is therefore desirable that impedances of conductive paths be minimized; in order to, for example, transmit high speed signals above the 1 Gb/sec range.

High performance materials and advanced layout technologies, such as IMPS (Interconnected Mesh Power system), focus on signal integrity to provide controlled impedance signal transmission with very low cross talk. Such an electrical interconnection provides a 10 Gb/s link over a distance less than 20 m using coaxial cable. However, coaxial cabling is bulky; therefore, it is not suitable for high density interconnection applications. Electrical interconnects operating at high frequency region have many problems to be solved such as crosstalk, impedance matching, power dissipation, skew, and packing density. However, there is a little hope to solve all of the problems. Optical interconnection does, however, have several advantages, such as immunity to the electromagnetic interference, independency to impedance mismatch, less power consumption, and high speed operation. Although the optical interconnects have great advantages compared to the copper interconnection, they still have some difficulties regarding packaging, multi-layer technology, signal tapping, and re-workability.

The employment of optical interconnects will be one of the major alternatives for upgrading the interconnection speed whenever conventional electrical interconnection fails to provide the required bandwidth. In fact, several optical interconnect techniques, such as free space, guided wave, board level, and fiber array interconnections have been introduced for system level applications. Although these techniques successfully demonstrated high speed optical interconnection, they continue to have packaging difficulties.

Machine to machine interconnection has already been significantly replaced by optical means. The major research thrusts in optical interconnection are in the backplane and board level where the interconnection distance, the associated parasitic RLC effects, the large fan-out induced impedance mismatch jeopardize the bandwidth requirements, and interference, such as crosstalk, skew and reflection. Optical interconnection has been widely agreed as a better alternative to upgrade the system performance. For these reasons, a conductive layer having relatively high impedance can be replaced by an optical waveguide, which can transmit signals at the speed of light. Waveguides are particularly beneficial when transmitting high speed signals over relatively long distances, as signal loss is minimized.

While embedded waveguides may be formed in a board or semiconductor substrate, difficulties arise when converting electrical signals emanating from an integrated circuit, mounted on the board's surface, to optical signals within the embedded waveguide. Some conventional conversion schemes employ light emitting lasers as transmitters and photo-detectors as receivers, mounted on the upper surface of a board adjacent bonding pads/sockets, which receive integrated circuit pins. The electrical signal from an output pin of an integrated circuit is transmitted, via a conductor at or above the board's surface, to the light emanating laser; which then converts the electrical signal to optical energy. That optical energy permeates from the board surface, through several layers of the board, downward to a waveguide embedded within the board. A grating coupler is typically placed within the waveguide to receive the optical energy and directionally transmit an appropriate wave through the waveguide; eventually to be received by an optical receiver distally located from the grating. An optical receiver can be placed proximate to another integrated circuit, separate from the integrated circuit initiating the transmitted optical signal. The optical receiver can then receive the optical energy, converting it to an electrical signal to be transmitted to an input pin of the receiving integrated circuit.

Thus, using an optical waveguide enhances the speed at which signals can be transmitted between integrated circuits. However, inefficiencies in transmitting optical energy through several layers of conductive and non-conductive materials within a board limit the light-to-electrical and electrical-to-light (optoelectronic) coupling efficiency; thereby limiting high-speed signal transmission within a system.

Additionally, conventional optoelectronic interconnect systems are typically incompatible with commercial manufacturing processes utilizing boards. Consider, for example, a printed circuit board used as a motherboard within a personal computer. A motherboard manufacturer will typically, if not exclusively, use automated equipment and processes to mount desired semiconductor devices on the surface of a printed circuit board. Optoelectronic devices often require care in handling and processing that standard semiconductor devices do not. Therefore, use of conventional optoelectronic interconnect systems will either require modification of standard manufacturing processes or additional processing steps to account for the presence or addition of optoelectronic components on the board surface. Additional monetary and time costs resulting from use of conventional optoelectronic interconnect systems thus render these approaches commercially unviable Moreover, semiconductor lasers dissipate a lot of electrical power, so generated heat can cause catastrophic failure of the laser device without proper cooling. The embedded lasers are also thermally isolated by surrounding insulators, so heat builds up and the operating temperature increases. In addition, an embedded laser cannot be replaced or repaired in a fully embedded integration. As a result, proper thermal management of the laser is pivotal. Present technologies attempt to solve this problem by using a thermal conductive heat sink assembled on top of the printed circuit board to cool down the semiconductor laser. These heat sinks are bulky and occupy real estate of the printed circuit board, which makes alignment to the optical medium, such as an optical waveguide, difficult.

As described in U.S. Pat. No. 6,243,509 issued on Jun. 5, 2001, fully embedded PCB level optical interconnects make the packaging reliable and robust. It provides not only process compatibility with a standard PCB process but also reduced footprint of PCB through fully embedding all optical components such as light sources, channel waveguides and detectors among other electrical interconnection layers. However, in this configuration, VCSEL (Vertical Cavity Surface Emitting Laser) array as a light source encounters a thermal management concern for the active region of the VCSEL arrays because it is encapsulated with thermal insulators such as polymer waveguide and bonding film (prepreg). Only the common bottom metal contact of the VCSEL array can be used as a thermal interface. The VCSEL cannot operate without proper cooling. Therefore heat management of driving such a VCSEL array is a critical issue in the fully embedded structure.

Another issue regarding electrical-to-optical transmitters disposed within a printed circuit board involves the fabrication of the reflective elements. The reflective elements are 45 degree waveguide micro-mirror couplers used to couple light into and out of the waveguides at 90 degrees. For example, the angle of the plane of the optical waveguide and the propagation direction of the light source is 90 degrees. The reflective elements or 45 degree waveguides are typically fabricated using laser ablation, oblique reactive ion etching (RIE), temperature controlled RIE, re-flow and machining. The laser ablation method is a slow process that is not suitable for the fabrication of a large number of micro-mirros. In addition, it is subjected to lower throughput and surface damage (does not leave a smooth surface, which causes scattering losses). The oblique RIE method is limited by directional freedom, so it cannot be used if the layout is complex (e.g., different direction of micro-mirrors). The temperature controlled RIE method is free from directional freedom but the quality of the mirror depends on process and materials. The re-flow method is also subjected to lower throughput. The machining provides good surface profile; however, it is difficult to cut individual waveguide on a substrate due to the physical size of the machining tool.

Yet another issue regarding electrical-to-optical transmitters disposed within a printed circuit board involves the fabrication of the channel waveguide structure. Typically, the channel waveguide structure is fabricated using photolithography, reactive ion etching, laser ablation, imprinting or molding. The reactive ion etch (RIE) uses ionized gas to remove material where it is not protected by a mask material in a vacuum chamber. The size of the substrate purely depends on the vacuum chamber. It is relatively free from material selection because RIE is a physical removing process. The lithography uses optically transparent and photosensitive materials. Exposed or unexposed area by UV light makes the material insoluble to solvent due to the cross linking of molecule. However, there is a limitation for choosing material due to the lack of materials which have optical transparency in the interested region and photosensitivity. Hot embossing and molding are indirect fabrication techniques by means of transferring waveguide structure on the substrate. Embossing plate or cast is first fabricated using the master waveguide pattern. Once the plate or the cast was fabricated, the rest of processes are purely replication steps. Therefore, these fabrication techniques are suitable for mass production like stamping of compact disk. Laser ablation technique is similar to carving without a using chisel. Highly intensive UV laser beam removes the material of unwanted region. The motion stage which holds waveguide substrate is moved along the predefined paths. Therefore, processing time is quite long. It is a quite versatile tool for small quantities in fabrication and does not require a mask pattern. All of these processes, except for imprinting and molding have a slow process time and are not suitable for making large format optical components, such as waveguides or couplers or for use in mass production lines. The imprinting method can be used to make large scale optical waveguide layers, but the fabrication process is complex.

There is, therefore, a need for a system, method and apparatus for improved electrical-to-optical transmitters disposed within a printed circuit board using improved heat dissipation and fabrication techniques.

SUMMARY OF THE INVENTION

The present invention uses inventive heat dissipation and fabrication techniques to improve electrical-to-optical transmitters disposed within a printed circuit board. First, the present invention provides an effective heat sink embedded within the electro-optical hybrid printed circuit board using a simple and reliable fabrication process that does not require additional steps. Second, the present invention provides an improved method to fabricate the reflective element disposed within the channel waveguide structure. Third, the present invention provides an improved method to fabricate the channel waveguide structure.

With respect to the heat sink, the present invention uses a thermal conductive material deposited underneath the thin film lasers that are fully embedded inside the PCB. The thermal conductive material can be copper, thermal conductive paste, combination of copper and paste or other suitable material. For example, a heat sink comprising a very thin directly electro-deposited copper film can be fabricated using standard electrical copper plating processes which are commonly used to fabricate thick copper electrical traces. Although thermal conductive pastes can be used, copper film, which is a highly thermal conductive material, directly deposited on the devices provides an ideal heat sink. Heat dissipation using heat sinks in accordance with the present invention are significant. The heat sink is fabricated by electroplating, which is a standard process for PCB to fabricate thick electrical traces. In addition, this process reduces manufacturing costs by simplifying the assembly process. In spite of the importance of dissipating heat, effective heat dissipation is very difficult to realize, especially in fully embedded board level optical interconnects due to the fact that all optical components are buried between thermally insulated materials, such as interlayer dielectric material. Thermal conductive material, such as copper pillars and copper thin film, is used to make effective heat sink underneath the vertical cavity surface emitting lasers for the fully embedded structure that is crucial for next generation high speed board level interconnects.

The present invention provides a heat sink for an electrical-to-optical transmitter disposed within a cavity of a printed circuit board. The heat sink is a thermal conductive material disposed within the cavity and is thermally coupled to a bottom surface of the electrical-to-optical transmitter. A portion of the thermal conductive material extends approximately to an outer surface of a layer of the printed circuit board.

The heat sink may be implemented as part of a planarized signal communications system that includes a first index buffer layer within the printed circuit board, a second index buffer layer within the printed circuit board and a polymer waveguide disposed below the first and above the second index buffer layers. The electrical-to-optical transmitter is disposed within the first index buffer layer, adjoining the polymer waveguide. A reflective element is disposed within the polymer waveguide in direct alignment with the electrical-to-optical transmitter and is adapted to reflect optical energy from the electrical-to-optical transmitter along the polymer waveguide. An optical-to-electrical receiver is disposed within the first index buffer layer adjoining the polymer waveguide. A reflective element is disposed within the polymer waveguide in direct alignment with the optical-to-electrical receiver and is adapted to reflect optical energy from within the polymer waveguide to the optical-to-electrical receiver. An at least partially metal layer is disposed within the printed circuit board that is fabricated to provide electrical coupling between the electrical-to-optical transmitter and a surface of the printed circuit board, and between the optical-to-electrical receiver and the surface of the printed circuit board.

In addition, the heat sink may be implemented as part of an optoelectronic signal communications system that includes a substrate having a first surface and a waveguide structure fabricated within the substrate. The electrical-to-optical transmitter is fabricated within the substrate and in direct adjoinment with the waveguide structure. Similarly, a first reflective element is fabricated within the waveguide structure in direct alignment with the electrical-to-optical transmitter. An optical-to-electrical receiver is fabricated within the substrate and in direct adjoinment with the waveguide structure and a second reflective element fabricated within the waveguide structure in direct alignment with the optical-to-electrical receiver. An at least partially metal layer is disposed within the substrate and is fabricated to provide electrical coupling between the electrical-to-optical transmitter and the first surface, and between the optical-to-electrical receiver and the first surface.

The present invention also provides a printed circuit board that includes an electrical-to-optical transmitter disposed within a cavity of the printed circuit board and a heat sink disposed within the cavity wherein the heat sink is thermally coupled to a bottom surface of the electrical-to-optical transmitter and at least a portion of the heat sink extends approximately to an outer surface of a layer of the printed circuit board. A cooling device may also be thermally coupled to the heat sink. The printed circuit board may comprise a planarized signal communications system or an optoelectronic signal communications system.

In addition, the present invention provides a method for fabricating a heat sink for an electrical-to-optical transmitter disposed within a cavity of a printed circuit board. The electrical-to-optical transmitter disposed within a cavity of the printed circuit board is fabricated. A thermal conductive material is then deposited within the cavity wherein the thermal conductive material is thermally coupled to a bottom surface of the electrical-to-optical transmitter and at least a portion of the thermal conductive material extends approximately to an outer surface of a layer of the printed circuit board.

The present invention also provides an improved method to fabricate the reflective element disposed within the channel waveguide structure. The reflective element or micro-mirror coupler is formed by cutting the polymeric waveguide at a 45 degree angle using a very sharp blade. The fabrication of the reflective element using a motion stage controlled by computer is fast and easy. This method is faster and less complicated that using laser ablation or oblique reactive ion etching.

Moreover, the present invention provides an improved method to fabricate the channel waveguide structure. The channel waveguide structure is fabricated using a compression molding technique using UV/thermal cross linkable polymers. This method enables the simultaneous fabrication of high quality waveguides and couplers, which reduces process time and the number of required steps. In addition, this method can be used to fabricate large format optical interconnection layers and optical transmitter and/or receiver connectors. This method is better than the other available fabrication methods, such as photolithography, reactive ion etching, laser ablation, and imprinting.

The present invention also provides an optical waveguide circuit having a flexible optical waveguide film, an electrical-to-optical transmitter connected to the flexible optical waveguide film, a photoelectric detector connected to the flexible optical waveguide film, and a first and second reflective element to optically couple the electrical-to-optical transmitter to the photoelectric detector via the flexible optical waveguide film. The flexible optical waveguide film can be SU-8 photoresist. The first and second reflective elements can be waveguide mirror couplers fabricated using a microtome blade. The waveguide mirror couplers can have an angle of 45 degrees plus or minus 1.5 degrees. The optical waveguide circuit can have a coupling efficiency that is greater than 90%.

In addition, the present invention provides a method for fabricating an optical waveguide circuit by providing a waveguide layer, laminating the top of the waveguide film with a metallic foil, patterning the metallic foil to form top electrical pads for one or more electrical-to-optical transmitters, forming micro vias and bonding devices on the waveguide layer, and electroplating a metallic film on the back side of the electrical-to-optical transmitters. The waveguide layer can be fabricated using a soft molding process.

Other features and advantages of the present invention will be apparent to those of ordinary skill in the art upon reference to the following detailed description taken in conjunction with the accompanying drawings.

BRIEF DESCRIPTION OF THE DRAWINGS

The above and further advantages of the invention may be better understood by referring to the following description in conjunction with the accompanying drawings, in which.

DETAILED DESCRIPTION OF THE INVENTION

Figure 1:
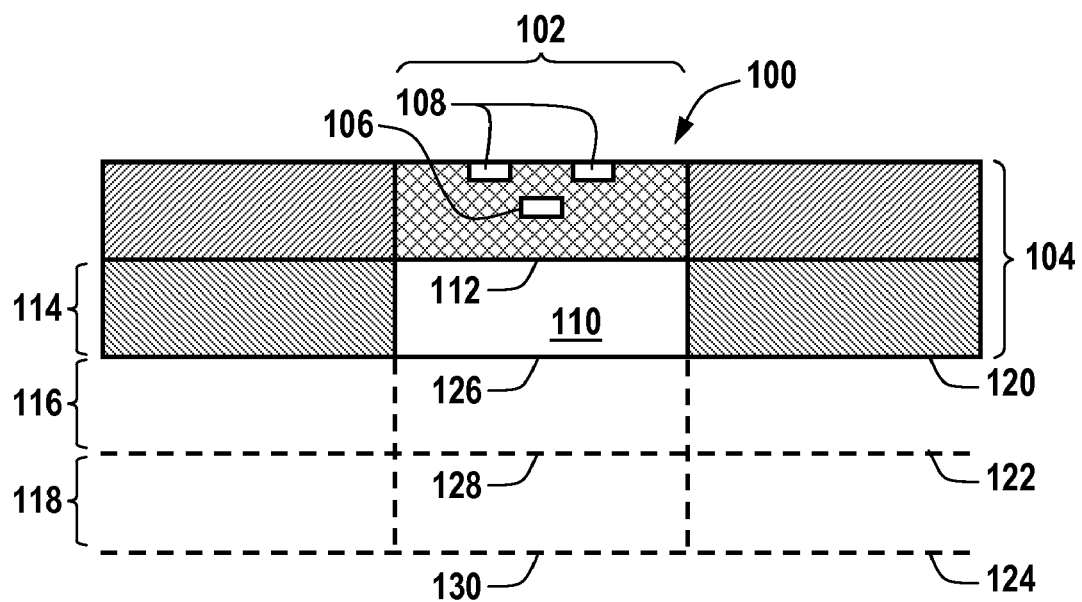
FIG. 1 is a cross-sectional view of one embodiment in accordance with the present invention.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

The present invention uses inventive heat dissipation and fabrication techniques to improve electrical-to-optical transmitters disposed within a printed circuit board. First, the present invention provides an effective heat sink embedded within the electro-optical hybrid printed circuit board using a simple and reliable fabrication process that does not require additional steps. Second, the present invention provides an improved method to fabricate the reflective element disposed within the channel waveguide structure. Third, the present invention provides an improved method to fabricate the channel waveguide structure.

With respect to the heat sink, the present invention uses a thermal conductive material deposited underneath the thin film lasers that are fully embedded inside the PCB. The thermal conductive material can be copper, thermal conductive paste, combination of copper and paste or other suitable material. For example, a heat sink comprising a very thin directly electro-deposited copper film can be fabricated using standard electrical copper plating processes which are commonly used to fabricate thick copper electrical traces. Although thermal conductive pastes can be used, copper film, which is a highly thermal conductive material, directly deposited on the devices provides an ideal heat sink. Heat dissipation using heat sinks in accordance with the present invention are significant. The heat sink is fabricated by electroplating, which is a standard process for PCB to fabricate thick electrical traces. In addition, this process reduces manufacturing costs by simplifying the assembly process. In spite of the importance of dissipating heat, effective heat dissipation is very difficult to realize, especially in fully embedded board level optical interconnects due to the fact that all optical components are buried between thermally insulated materials, such as interlayer dielectric material. Thermal conductive material, such as copper pillars and copper thin film, is used to make effective heat sink underneath the vertical cavity surface emitting lasers for the fully embedded structure that is crucial for next generation high speed board level interconnects.

The present invention also provides an improved method to fabricate the reflective element disposed within the channel waveguide structure. The reflective element or micro-mirror coupler is formed by cutting the polymeric waveguide at a 45 degree angle using a very sharp blade. The fabrication of the reflective element using a motion stage controlled by computer is fast and easy. This method is faster and less complicated that using laser ablation or oblique reactive ion etching.

Moreover, the present invention provides an improved method to fabricate the channel waveguide structure. The channel waveguide structure is fabricated using a compression molding technique using UV/thermal cross linkable polymers. This method enables the simultaneous fabrication of high quality waveguides and couplers, which reduces process time and, the number of required steps. In addition, this method can be used to fabricate large format optical interconnection layers and optical transmitter and/or receiver connectors. This method is better than the other available fabrication methods, such as photolithography, reactive ion etching, laser ablation, and imprinting.

Now referring to FIG. 1, a cross-sectional view of one embodiment in accordance with the present invention is shown. An electrical-to-optical transmitter 100 is disposed within a cavity 102 of a printed circuit board 104. The electrical-to-optical transmitter 100 has an aperture 106 and terminal pads 108. The electrical-to-optical transmitter 100 can be a laser, vertical cavity surface emitting laser (VCSEL) or an edge emitting laser. A heat sink 110 comprising a thermal conductive material is disposed within the cavity 102 wherein the thermal conductive material is thermally coupled to a bottom surface 112 of the electrical-to-optical transmitter 100 and at least a portion of the thermal conductive material extends approximately to an outer surface (120, 122, 124, etc.) of a layer (114, 116, 118, etc.) of the printed circuit board 104. As a result, the heat sink 110 may extend to surfaces 126, 128 or 130. Note that the dashed lines indicate that the heat sink 110 can occupy one or more layers of the printed circuit board and is not limited to a maximum of three layers as illustrated. In addition, the heat sink 110 can extend only partially into the next layer, although fabrication of such a heat sink 110 will be more difficult and costly.

The thermal conductive material can be copper, thermal conductive paste, combination of copper and a paste, or any other suitable material. As shown, the thermal conductive material substantially fills the cavity 102 from the bottom of the electrical-to-optical transmitter 100 to approximately the outer surface 126, 128 or 130 of a layer of the printed circuit board 114, 116 or 118. In typical applications, the electrical-to-optical transmitter 100 is between 10 and 250 μm in thickness and the heat sink 110 is between 10 and 490 μm in thickness. Note that a cooling device may be thermally coupled to a portion of the outer surface 126, 128 or 130 of the heat sink 110.

Figure 2:
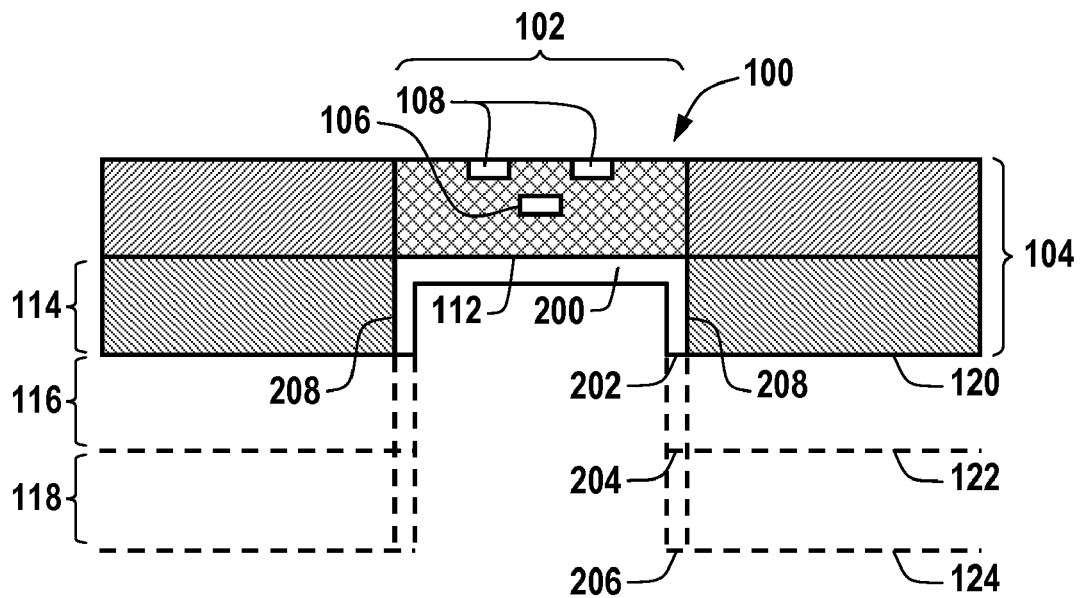
FIG. 2 is a cross-sectional view of another embodiment in accordance with the present invention.

Referring now to FIG. 2, a cross-sectional view of another embodiment in accordance with the present invention is shown. An electrical-to-optical transmitter 100 is disposed within a cavity 102 of a printed circuit board 104. The electrical-to-optical transmitter 100 has an aperture 106 and terminal pads 108. The electrical-to-optical transmitter 100 can be a laser, vertical cavity surface emitting laser (VCSEL) or an edge emitting laser. A heat sink 200 comprising a thermal conductive material is disposed within the cavity 102 wherein the thermal conductive material is thermally coupled to a bottom surface 112 of the electrical-to-optical transmitter 100 and at least a portion of the thermal conductive material extends approximately to an outer surface (120, 122, 124, etc.) of a layer (114, 116, 118, etc.) of the printed circuit board 104. As a result, the heat sink 200 may extend to surfaces 202, 204 or 206. Note that the dashed lines indicate that the heat sink 200 can occupy one or more layers of the printed circuit board and is not limited to a maximum of three layers as illustrated. In addition, the heat sink 200 can extend only partially into the next layer, although fabrication of such a heat sink 200 will be more difficult and costly.

The thermal conductive material can be copper, thermal conductive paste, combination of copper and a paste, or any other suitable material. As shown, the thermal conductive material comprises a film on the bottom surface 112 of the electrical-to-optical transmitter and an interior wall 208 of the cavity 102 extending approximately to the outer surface 126, 128 or 130 of a layer of the printed circuit board 114, 116 or 118. In typical applications, the electrical-to-optical transmitter 100 is between 10 and 250 μm in thickness and the film is approximately is approximately 10 to 50 μm in thickness (30 μm is typical). Note that a cooling device may be thermally coupled to a portion of the outer surface 202, 204 or 206 of the heat sink 200.

Figure 3:
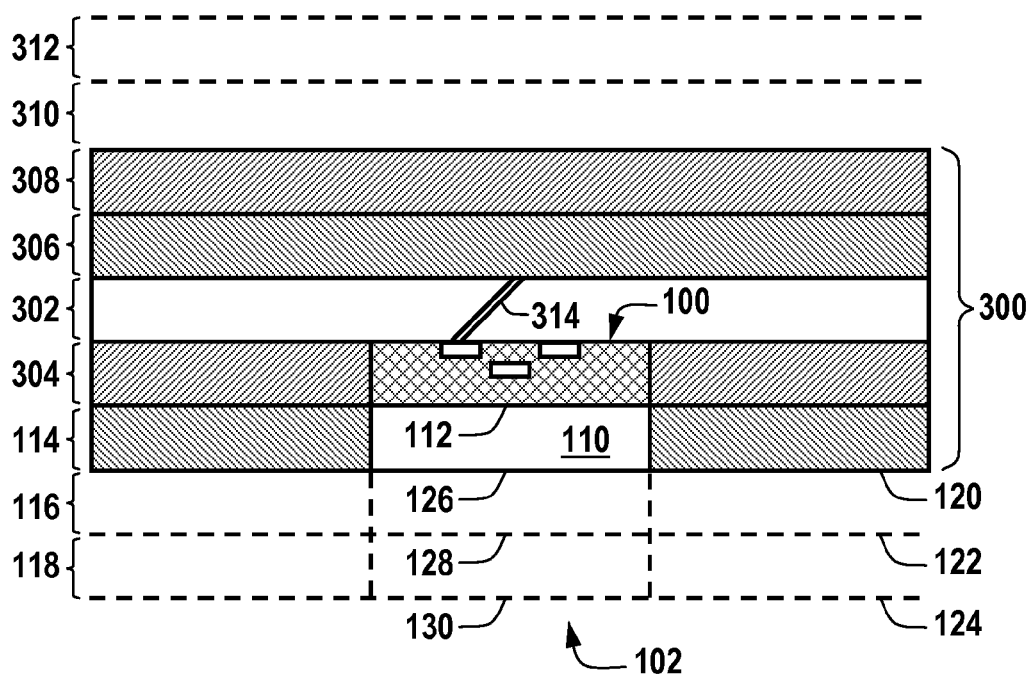
FIG. 3 is a cross-sectional view of one embodiment of the present invention disposed within a PCB.

Now referring to FIG. 3, a cross-sectional view of one embodiment of the present invention disposed within a PCB is shown. An electrical-to-optical transmitter 100 is disposed within a cavity 102 of a printed circuit board 300. The electrical-to-optical transmitter 100 can be a laser, vertical cavity surface emitting laser (VCSEL) or an edge emitting laser. A heat sink 110 comprising a thermal conductive material is disposed within the cavity 102 wherein the thermal conductive material is thermally coupled to a bottom surface 112 of the electrical-to-optical transmitter 100 and at least a portion of the thermal conductive material extends approximately to an outer surface (120, 122, 124, etc.) of a layer (114, 116, 118, etc.) of the printed circuit board 300. As a result, the heat sink 110 may extend to surfaces 126, 128 or 130. Note that the dashed lines indicate that the heat sink 110 can occupy one or more layers of the printed circuit board and is not limited to a maximum of three layers as illustrated. In addition, the heat sink 110 can extend only partially into the next layer, although fabrication of such a heat sink 110 will be more difficult and costly.

The thermal conductive material can be copper, thermal conductive paste, combination of copper and a paste, or any other suitable material. As shown, the thermal conductive material substantially fills the cavity 102 from the bottom of the electrical-to-optical transmitter 100 to approximately the outer surface 126, 128 or 130 of a layer of the printed circuit board 114, 116 or 118. In typical applications, the electrical-to-optical transmitter 100 is between 10 and 250 μm in thickness and the heat sink 110 is between 10 and 490 μm in thickness. Note that a cooling device may be thermally coupled to a portion of the outer surface 126, 128 or 130 of the heat sink 110.

A board level optical interconnect is formed by forming a channel waveguide structure 302 above a lower cladding layer 304 in which the electrical-to-optical transmitter 100 is embedded. An upper cladding layer 306 is disposed above the channel waveguide structure 302. One or more additional layers 308, 310 and 312 may be disposed above the upper cladding layer 306. A reflective element 314 is disposed within the channel waveguide structure 302 in direct alignment with the electrical-to-optical transmitter 100. Metal structures or vias (not shown) will be connected to the terminals of the electrical-to-optical transmitter 100.

The reflective elements 314 are 45 degree waveguide micro-mirror, couplers used to couple light into and out of the channel waveguide structure 302 at 90 degrees. For example, the angle of the plane of the optical waveguide 302 and the propagation direction of the light source (optical transmitter 100) is 90 degrees. Various methods can be used to fabricate the reflective elements 314 disposed within the channel waveguide structure 302, such as oblique reactive ion etching or laser ablation. The present invention uses an improved method wherein the reflective element 314 or micro-mirror coupler is formed by cutting the polymeric waveguide 302 at a 45 degree angle using a very sharp blade. The fabrication of the reflective element 314 using a motion stage controlled by computer is fast and easy. This method is faster and less complicated that using laser ablation or oblique reactive ion etching. This method will be described in more detail below.

Likewise, the channel waveguide structure 302 can be fabricated using various techniques, such as photolithography, reactive ion etching, laser ablation, imprinting or molding. The present invention uses an improved method wherein the channel waveguide structure 302 is fabricated using a compression molding technique using UV/thermal cross linkable polymers. This method enables the simultaneous fabrication of high quality waveguides 302 and couplers 314, which reduces process time and the number of required steps. In addition, this method can be used to fabricate large format optical interconnection layers and optical transmitter and/or receiver connectors. This method will be described in more detail below.

Figure 4:
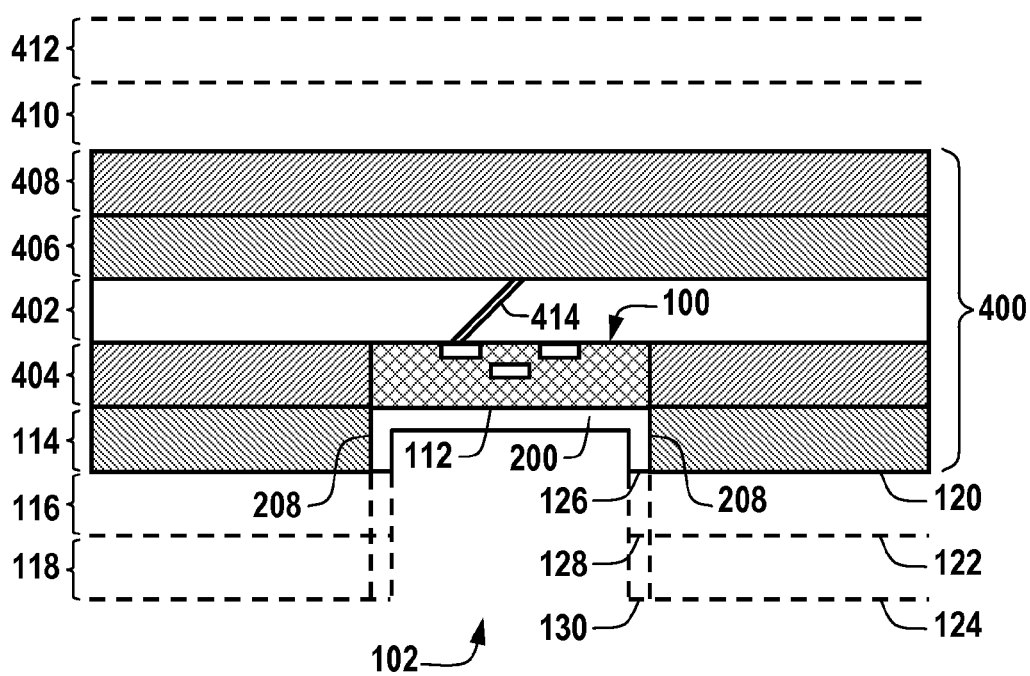
FIG. 4 is a cross-sectional view of another embodiment of the present invention disposed within a PCB.

Referring now to FIG. 4, a cross-sectional view of another embodiment of the present invention disposed within a PCB is shown. An electrical-to-optical transmitter 100 is disposed within a cavity 102 of a printed circuit board 400. The electrical-to-optical transmitter 100 can be a laser, vertical cavity surface emitting laser (VCSEL) or an edge emitting laser. A heat sink 200 comprising a thermal conductive material is disposed within the cavity 102 wherein the thermal conductive material is thermally coupled to a bottom surface 112 of the electrical-to-optical transmitter 100 and at least a portion of the thermal conductive material extends approximately to an outer surface (120, 122, 124, etc.) of a layer (114, 116, 118, etc.) of the printed circuit board 104. As a result, the heat sink 200 may extend to surfaces 202, 204 or 206. Note that the dashed lines indicate that the heat sink 200 can occupy one or more layers of the printed circuit board and is not limited to a maximum of three layers as illustrated. In addition, the heat sink 200 can extend only partially into the next layer, although fabrication of such a heat sink 200 will be more difficult and costly.

The thermal conductive material can be copper, thermal conductive paste, combination of copper and a paste, or any other suitable material. As shown, the thermal conductive material comprises a film on the bottom surface 112 of the electrical-to-optical transmitter and an interior wall 208 of the cavity 102 extending approximately to the outer surface 126, 128 or 130 of a layer of the printed circuit board 114, 116 or 118. In typical applications, the electrical-to-optical transmitter 100 is between 10 and 250 μm in thickness and the film is approximately is approximately 10 to 50 μm in thickness (30 μm is typical). Note that a cooling device may be thermally coupled to a portion of the outer surface 202, 204 or 206 of the heat sink 200.

A board level optical interconnect is formed by forming a channel waveguide structure 402 above a lower cladding layer 404 in which the electrical-to-optical transmitter 100 is embedded. An upper cladding layer 406 is disposed above the channel waveguide structure 402. One or more additional layers 408, 410 and 412 may be disposed above the upper cladding layer 406. A reflective element 414 is disposed within the channel waveguide structure 402 in direct alignment with the electrical-to-optical transmitter 100. Metal structures or vias (not shown) will be connected to the terminals of the electrical-to-optical transmitter 100.

The reflective elements 414 are 45 degree waveguide micro-mirror couplers used to couple light into and out of the channel waveguide structure 402 at 90 degrees. For example, the angle of the plane of the optical waveguide 402 and the propagation direction of the light source (optical transmitter 100) is 90 degrees. Various methods can be used to fabricate the reflective element 414 disposed within the channel waveguide structure 402, such as oblique reactive ion etching or laser ablation. The present invention uses an improved method wherein the reflective element 414 or micro-mirror coupler is formed by cutting the polymeric waveguide 402 at a 45 degree angle using a very sharp blade. The fabrication of the reflective element 414 using a motion stage controlled by computer is fast and easy. This method is faster and less complicated that using laser ablation or oblique reactive ion etching. This method will be described in more detail below.

Likewise, the channel waveguide structure 402 can be fabricated using various techniques, such as photolithography, reactive ion etching, laser ablation, imprinting or molding. The present invention uses an improved method wherein the channel waveguide structure 402 is fabricated using a compression molding technique using UV/thermal cross linkable polymers. This method enables the simultaneous fabrication of high quality waveguides 402 and couplers 414, which reduces process time and the number of required steps. In addition, this method can be used to fabricate large format optical interconnection layers and optical transmitter and/or receiver connectors. This method will be described in more detail below.

Now referring to FIGS. 5A, 5B, 5C, 5D, 5E and 5F, cross-sectional views illustrating one fabrication process in accordance with the present invention are shown. The system described is one embodiment of an optoelectronic signal communications system according to the present invention using a multi-layer printed circuit board wherein semiconductor devices can be mounted on its external surfaces. A planar, optoelectrical communications system is embedded within the board, integrated amongst various metallization and dielectric layers. More specifically, an electrical-to-optical transmitter or VCSEL 500 having a n-contact pad 502 is disposed on top of PWB layer 504. Depending on desired wavelength, accuracy, and other design considerations, other suitable electrical-to-optical conversion devices, such as edge emitting lasers, may be employed. Using VCSELs, however, a modulation bandwidth as high as 6 GHZ may be realized at a wavelength of 850 nm. Additionally, such a wavelength is compatible with silicon based photo-detectors. The VCSEL 500 may be fabricated using thin-film processes known in the art (e.g. epitaxial lift off). Most importantly, VCSEL 500 is fabricated using processes compatible with those used to fabricate the printed circuit board as the board is being fabricated. Cavity 506 is formed to accommodate a heat sink or thermal via in accordance with the present invention.

Figure 5A:
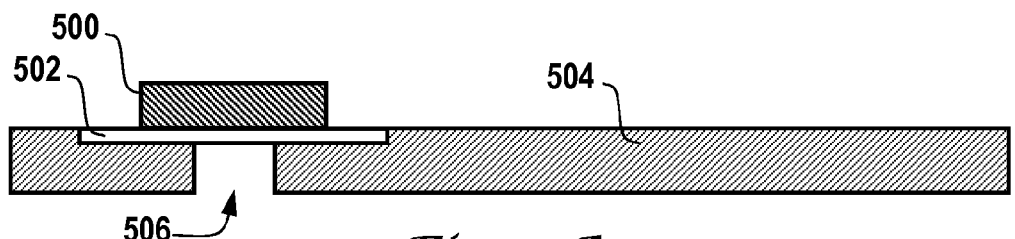
FIGS. 5A, 5B, 5C, 5D, 5E and 5F are cross-sectional views illustrating one fabrication process in accordance with the present invention.
Figure 5B:
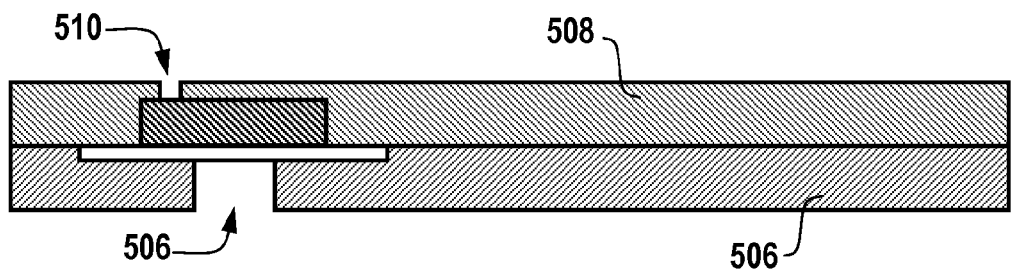
Figure 5C:
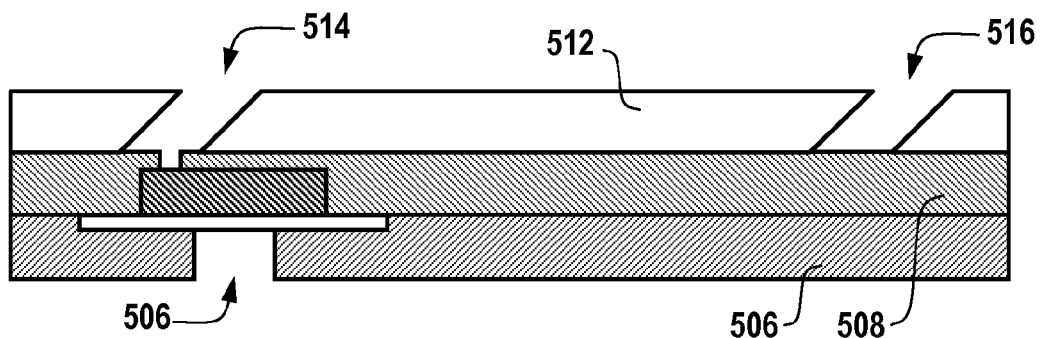

Lower cladding layer 508 (also referred to as an index buffer layer) and via 510 to establish electrical contact to the p-contact pads of the VCSEL 500 are formed in FIG. 5B. A channel waveguide structure 512 is formed on the lower cladding layer 508 and includes reflective element cavities 514 and 516 in FIG. 5C. In a preferred embodiment, waveguide 512 is a polyimide-based waveguide. Such a polyimide waveguide may be fabricated on different substrates such as PC board silicon, glass, and others by spin coating. For example, an A-600 primer layer may be spin coated first on a substrate with a spin speed of 5000 rpm, and prebaked at 90° C. for 60 seconds. Next, a polyimide, such as Amoco Polyimide 9120D, is spin coated with a speed of 2000 RPM. A final curing at 260° C. in nitrogen atmosphere for more than 3 hours is completed. Typical thickness of a resulting waveguide is 7 µm. Planar waveguides have also been fabricated on silicon substrate by inserting a high index polyimide layer (N=1.56 to 1.76) between 90/20D cladding layers.

In a preferred embodiment, present invention uses an improved method wherein the channel waveguide structure 512 is fabricated using a compression molding technique using UV/thermal cross linkable polymers. This method enables the simultaneous fabrication of high quality waveguides and couplers, which reduces process time and the number of required steps. In addition, this method can be used to fabricate large format optical interconnection layers and optical transmitter and/or receiver connectors.

Figure 5D:
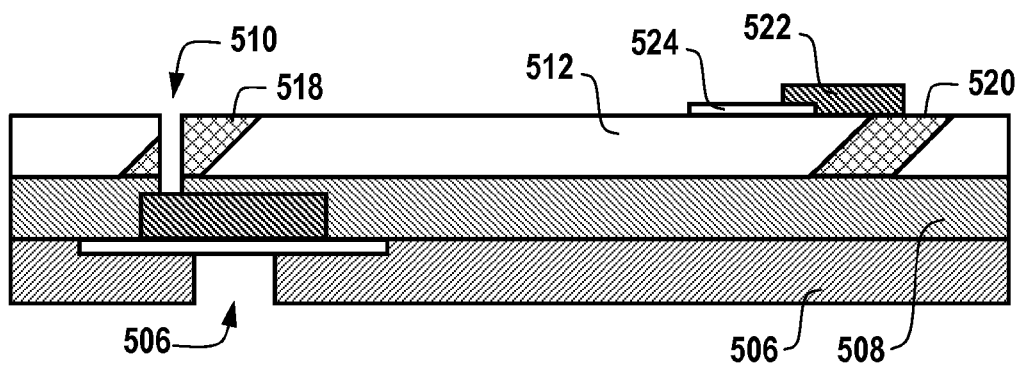
Figure 5E:
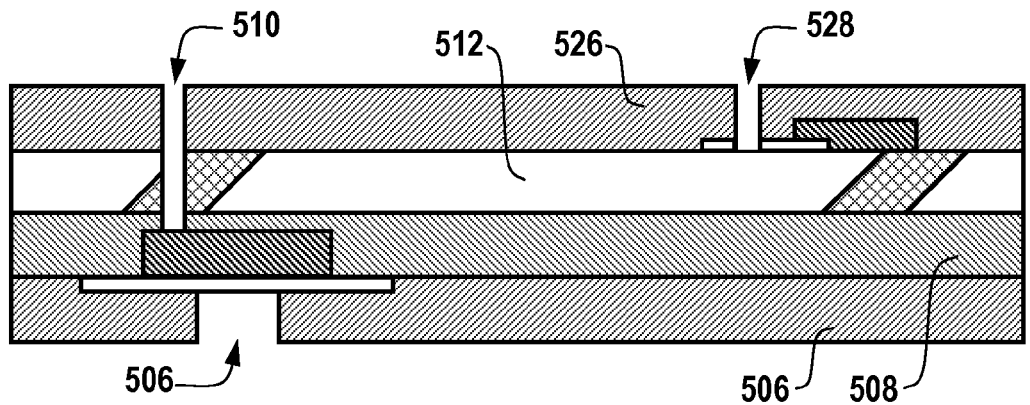

The reflective elements 518 and 520 are formed in the reflective element cavities 514 and 516, respectively, while maintaining via 510 in FIG. 5D. Reflective elements 518 and 520 may comprise any suitable structure adaptable to provide efficient optoelectronic coupling, capable of co-fabrication with waveguide 512. Depending on desired performance and manufacturing parameters, mirror structures may be utilized. In a preferred embodiment, however, tilted waveguide gratings are employed to provide a 1 to 1 surface normal coupling. In this embodiment, both the waveguide(s) and the tilted gratings are polyimide based, to provide high temperature processing associated with silicon process fabrication. More specifically, the embodiment incorporates a titled grating profile in a planar structure within a thin waveguide layer upon which other micro-lithographically defined electrical interconnection layers can be built. Such a configuration requires the insertion of optical interconnect layer to be planarized. The tilted grating profile greatly enhances coupling efficiency in the desired direction. Such gratings may be fabricated with known micro-fabrication processes; rendering them mass-producible with excellent accuracy and reproducibility. As an example, such a grating coupler may be fabricated by reactive-ion-etching (RIE).

In a preferred embodiment, the present invention uses an improved method wherein the reflective element 518 and 520 or micro-mirror coupler is formed by cutting the polymeric waveguide 512 at a 45 degree angle using a very sharp blade. The fabrication of the reflective element 518 and 520 using a motion stage controlled by computer is fast and easy. This method is faster and less complicated that using laser ablation or oblique reactive ion etching. This method will be described in more detail below.

An optical-to-electrical receiver or silicon-based photodetector 522 having contact pad 524 is also fabricated. As such, photodetector 522 may be fabricated by a silicon metal-semiconductor-metal (MSM) process. Again, depending on desired performance characteristics and production parameters, other suitable optical-to-electrical conversion devices may be used. Photodetector 522 is fabricated using processes compatible with those used to fabricate the board. Upper cladding layer 526 is disposed above channel waveguide structure 512 and maintains via 510 in FIG. 5E. Via 528 is also formed to provide electrical contact to the photodetector contact pad 524. The VCSEL 500 generates optical energy to be generated directly into waveguide 512. Similarly photodetector 522 allows optical energy to be drawn directly from waveguide 512. Reflective elements 518 and 520 are formed within waveguide 512 in alignment with elements 500 and 522, to provide direction of transmitted optical energy. The present invention thus provides highly efficient optoelectronic coupling.

Figure 5F:
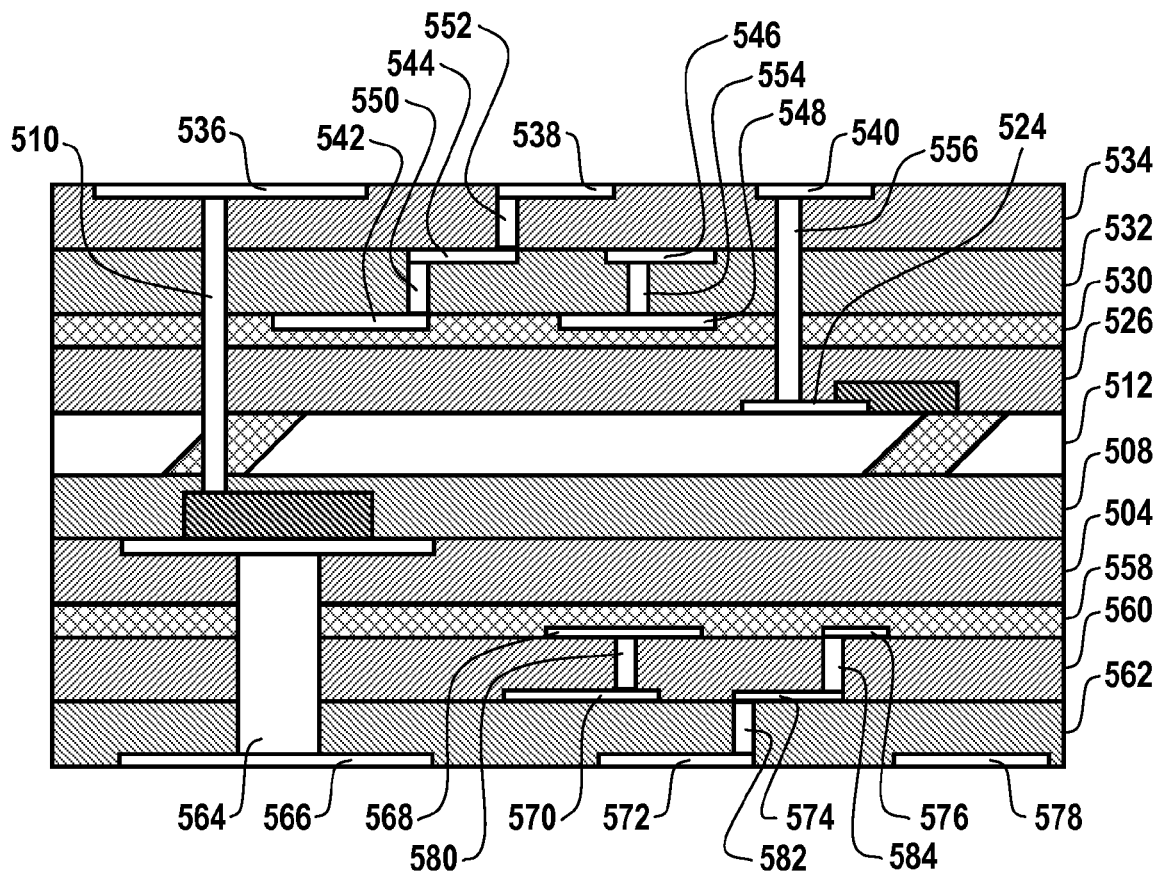

In FIG. 5F, adhesive layer 530 is disposed above the upper cladding layer 526. In addition, one or more PWB layers, such as 532 and 534 are disposed above the adhesive layer 530. Various copper traces 536, 538, 540, 542, 544, 546 and 548 are created at various levels as dictated by the applicable design requirements. Copper trace 536 is connected to the VCSEL 500 by via 510. Copper trace 542 is connected to trace 544 by via 550 and trace 544 is connected to trace 538 by via 552. Copper trace 546 is connected to copper trace 548 by via 554. Copper trace 540 is connected to contact pad 524 by via 556. Similarly, adhesive layer 558 is disposed below the PWB layer 504 with one or more PWB layers, such as 560 and 562 disposed below adhesive layer 558. Cavity 506 is filled with a thermal conductive material as shown in FIG. 1 or 2 in order to form heat sink 564, which may be connected to a copper trace or additional heat sink 566. Various copper traces 568, 570, 572, 574, 576 and 578 are created at various levels as dictated by the applicable design requirements. Copper trace 568 is connected to trace 570 by via 580. Copper trace 572 is connected to copper trace 574 by via 582 and copper trace 574 is connected to copper trace 576 by via 584. The vias and copper traces can be used to provide direct coupling between the embedded optoelectronic elements and the board surface, which provides the capability to utilize a variety of integrated circuit devices including a surface mount device or standard pin mount device. Thus, integrated circuit devices may be mounted on the board using standard assembly and manufacturing processes. The presence of the optoelectronic components is realized only in higher performance; that presence otherwise being transparent to the user of the board.

Based on the foregoing description, it is apparent that the heat sink may be implemented as part of a planarized signal communications system that includes a first index buffer layer within the printed circuit board, a second index buffer layer within the printed circuit board and a polymer waveguide disposed below the first and above the second index buffer layers. The electrical-to-optical transmitter is disposed within the first index buffer layer, adjoining the polymer waveguide. A reflective element is disposed within the polymer waveguide in direct alignment with the electrical-to-optical transmitter and is adapted to reflect optical energy from the electrical-to-optical transmitter along the polymer waveguide. An optical-to-electrical receiver is disposed within the first index buffer layer adjoining the polymer waveguide. A reflective element is disposed within the polymer waveguide in direct alignment with the optical-to-electrical receiver and is adapted to reflect optical energy from within the polymer waveguide to the optical-to-electrical receiver. An at least partially metal layer is disposed within the printed circuit board that is fabricated to provide electrical coupling between the electrical-to-optical transmitter and a surface of the printed circuit board, and between the optical-to-electrical receiver and the surface of the printed circuit board.

In addition, the heat sink may be implemented as part of an optoelectronic signal communications system that includes a substrate having a first surface and a waveguide structure fabricated within the substrate. The electrical-to-optical transmitter is fabricated within the substrate and in direct adjoinment with the waveguide structure. Similarly, a first reflective element is fabricated within the waveguide structure in direct alignment with the electrical-to-optical transmitter. An optical-to-electrical receiver is fabricated within the substrate and in direct adjoinment with the waveguide structure and a second reflective element fabricated within the waveguide structure in direct alignment with the optical-to-electrical receiver. An at least partially metal layer is disposed within the substrate and is fabricated to provide electrical coupling between the electrical-to-optical transmitter and the first surface, and between the optical-to-electrical receiver and the first surface.

The present invention also provides a printed circuit board that includes an electrical-to-optical transmitter disposed within a cavity of the printed circuit board and a heat sink disposed within the cavity wherein the heat sink is thermally coupled to a bottom surface of the electrical-to-optical transmitter and at least a portion of the heat sink extends approximately to an outer surface of a layer of the printed circuit board. A cooling device may also be thermally coupled to the heat sink. The printed circuit board may comprise a planarized signal communications system or an optoelectronic signal communications system.

In addition, the present invention provides a method for fabricating a heat sink for an electrical-to-optical transmitter disposed within a cavity of a printed circuit board. The electrical-to-optical transmitter disposed within a cavity of the printed circuit board is fabricated. A thermal conductive material is then deposited within the cavity wherein the thermal conductive material is thermally coupled to a bottom surface of the electrical-to-optical transmitter and at least a portion of the thermal conductive material extends approximately to an outer surface of a layer of the printed circuit board.

Figure 6:
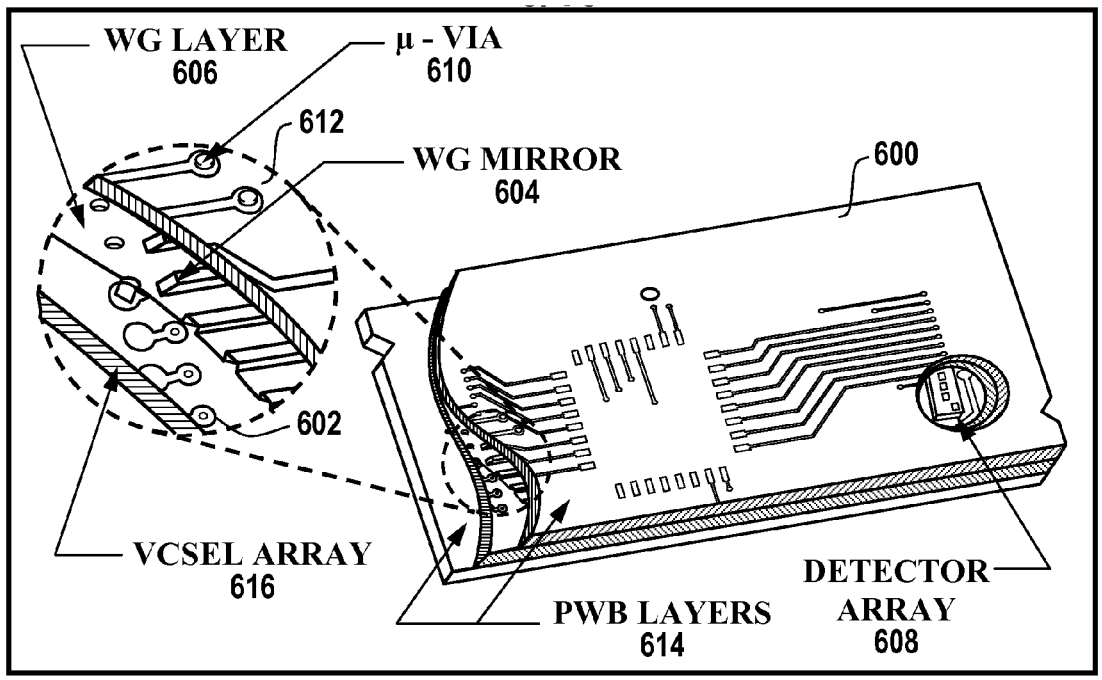
FIG. 6 illustrates fully embedded PCB level optical interconnects in accordance with the present invention.

FIG. 6 illustrates fully embedded PCB level optical interconnects in accordance with the present invention. The fully embedded board-level guided wave optical interconnection provides high speed optical communications within one board 600. These include a vertical cavity surface emitting laser (VCSEL) 602, surface-normal waveguide couplers 604, and a polymer-based channel waveguide 606 functioning as the physical layer of optical bus (interconnection) and an optical-to-electrical receiver or photoreceiver 608. The driving electrical signals to modulate the VCSEL 602 and the demodulated signals received at the photoreceiver 608 flow through electrical vias 610 connecting to the surface 612 of the PC board 600. The fully embedded structure makes the insertion of optoelectronic components into microelectronic systems much more realistic when considering the fact that the major stumbling block for implementing optical interconnection onto high performance microelectronics is the packaging incompatibility. All the real estate of the PCB surface is occupied by electronics not by optoelectronic components. The performance enhancement due to the employment of the optical interconnection has been observed without the interface problems between electronic and optoelectronic components that conventional approaches have.

Various embodiments of the present invention were fabricated and tested. The following describes this fabrication process and testing as an example and not as a limitation of the present invention. To provide system integration using guided wave optical interconnection, polymer-based material has its exclusive advantages. It can be spin-coated on a myriad of substrates with a relatively large interconnection distance. To ensure the desired electrical and mechanical properties imposed on board level optical interconnection, and to meet the required optical properties for the low loss waveguide formation, the photosensitive polyimide provided by Amoco Chemicals was used for the waveguide fabrication. 45° total internal reflection (TIR) mirrors were fabricated by oblique reactive ion etching (RIE) to provide surface normal coupling. The propagation loss of the TE mode of the channel waveguide is 0.21 dB/cm at 850 nm.

The crosstalk of parallel channel waveguides is important factor in communication. The channel waveguide pitch is 250 μm and the width of waveguide is 50 μm. The refractive difference between core and cladding is about 0.01. To measure crosstalk, the sample was put on auto-aligner and the fiber coupled laser light with wavelength of 630 nm was lunched into one channel among the waveguides. The output of the signal was detected from the adjacent channel from the input channel. The input power at waveguide is −21 dBm and the output power of the adjacent channel is −53 dBm. The measured crosstalk was 32 dB.

High performance vertical cavity surface emitting lasers (VCSELs) are commercially available with the output wavelength of 850 nm. These laser devices, compared to conventional edge emitting lasers, provide a very low threshold current with much less temperature sensitivity, moderate optical power (few mW), very high direct modulation bandwidth (>14 GHz), wide operating temperature range (−55 to +125° C.), and ease of packaging in an array configuration due to the unique surface-normal output nature. Planar configuration of VCSELs allows these devices to be fabricated, wafer scale tested with conventional microelectronics manufacturing processes. The unique surface-normal emitting nature of the device allows us to use exactly the same packaging scheme for coupling light from VCSEL into waveguide as that used for coupling light from waveguide into photodetector.

All optical components including VCSEL arrays, photodetector arrays and planarized waveguide arrays are fully embedded among electrical layers in the board level optical interconnects. As a result, the assembly steps at final laminating stage are simplified using standard PCB manufacturing procedure. Generally, 5 to 10 mils (127 to 254 μm) thick copper laminated polymer layer and 4 mils thick (100 μm) bonding films are used in multi layer PCB. For the fully embedded structure, thin VCSEL and photo-detector, both are 10 μm thick, are buried among electrical PCB layers. Each of electrical PWB layers 614 functions to distribute electrical signals or power or as grounding layer as shown in FIG. 6. Through-holes and vias 610 are used to transport electrical signals among electrical PWB layers 614 and also to provide electrical connections to VCSEL 616 and detector 608 arrays. In the fully embedded structure, entire real estates of top and/or bottom sides of the PCB are occupied only with microelectronic ICs which perform the designated functions including electrical-to-optical and optical-to-electrical conversions through vias 610 connected thin film VCSELs 602 and photo-detectors 608.

To incorporate the VCSEL array onto the fully embedded architecture, the VCSEL array has to be thin enough to build such a 3-D structure. An oxide confined thin film linear VCSEL array was fabricated. A fully embedded board-level guided wave optical interconnection is presented. All elements involved in providing high speed optical communications within one board are demonstrated. These include a thin vertical cavity surface emitting laser (VCSEL), surface-normal waveguide couplers, a polyimide-based channel waveguide functioning as the physical layer of optical bus and a photoreceiver. The driving electrical signal to modulate the VCSEL and the demodulated signal received at the photoreceiver can be applied through electrical vias connecting to the surface of the PC board. The epitaxial structure of the VCSEL array was grown on GaAs substrate. An etch stop layer of 100 nm thick $Al_{0.98}Ga_{0.02}As$ was grown and then GaAs buffer layer, 40.5 pairs of n-DBR, three GaAs quantum wells, and 23 pairs of p-DBR were grown. Total thickness of epitaxial structure is 10 μm.

Figure 7A:
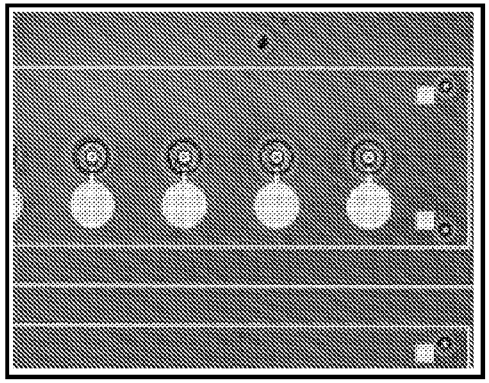
FIGS. 7A, 7B and 7C illustrate the four parts of a VCSEL array, a SEM picture of 10 μm thick VCSEL, and an enlarged view of a VCSEL in accordance with the present invention.
Figure 7B:
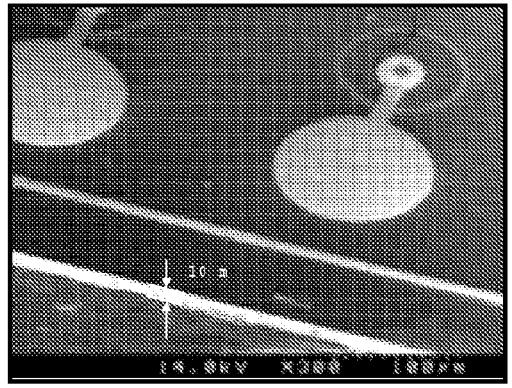
Figure 7C:
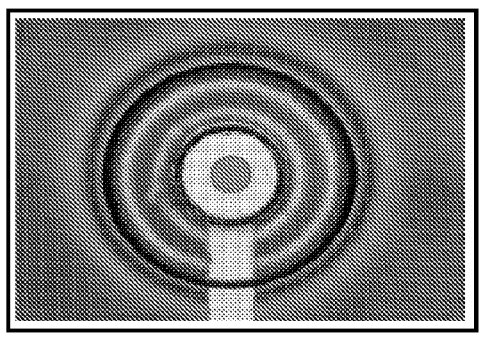

Formation of thin film VCSEL arrays started with wet etch to make annular shape trench which provides isolation of each device and defines oxide confinement region. Wet oxidation was carried out in quartz tube furnace which was held at 460° C. Spin on glass (SOG) was coated on the entire wafer for electrical isolation and side wall sealing afterwards. The SOG opening process was followed for p-contact metallization. VCSEL array formation was followed by the substrate removal process to form the required thickness. Devices were first mechanically thinned down to 250 μm. These devices were back etched using wet etching to make various thick VCSELs (200, 150, 100 μm). Ten micrometer thick VCSEL was formed. FIG. 7A shows fabricated 1×12 VCSEL arrays and FIG. 7B shows cross section view of 10 μm thick VCSEL array after substrate removal. FIG. 7C illustrates an enlarged view of a VCSEL in accordance with the present invention.

Figure 8:
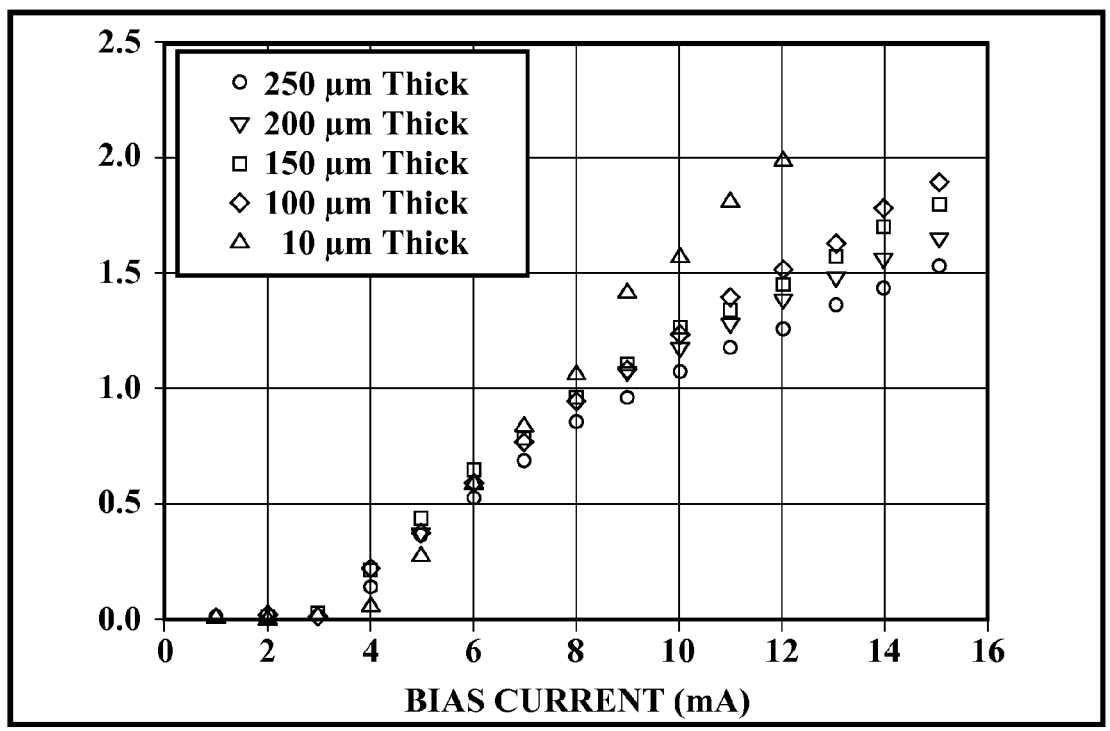
FIG. 8 is a graph displaying the Light-Current characteristics as a function of device thickness in accordance with the present invention.
Figure 9:
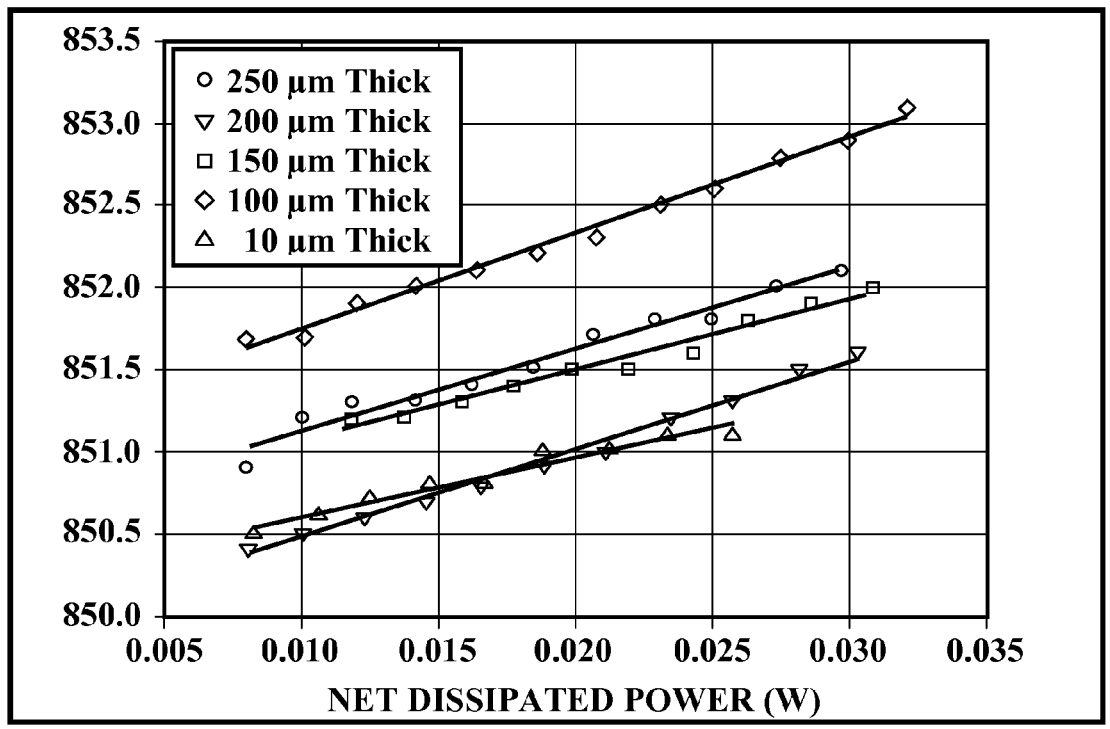
FIG. 9 is a graph displaying wavelength shift as a function of net dissipated power in accordance with the present invention.

FIG. 8 is a graph displaying the Light-Current characteristics as a function of device thickness in accordance with the present invention. The Light-Current ("L-I") characteristics of various thinned VCSELs are shown where the quantum efficiency of the 10 μm thick VCSEL is increased by ~50% then the driving current is above 9 mA. Threshold current were 3.5 mA for all devices without showing any degradation, however slope efficiency was increased by reducing device thickness due to the reducing device thermal resistance. The substrate removed VCSEL (10 μm thick) shows higher slope efficiency than thicker devices did (FIG. 9). By reducing device thickness, more strate slope efficiency is obtained, even high injection current level.

The substrate removed VCSEL (10 μm thick) also shows linear dependency even at high injection current. Thermal resistance was calculated from the measured wavelength shift as a function of substrate temperature and dissipation power. The thermal resistance is given by $R_{th}=\Delta T/\Delta P=(\Delta\lambda/\Delta P)/(\Delta\lambda/\Delta T)$, where $\Delta T$ is the change of junction temperature, $\Delta P$ is the change of injected power and $\Delta\lambda$ is the wavelength shift. Both $\Delta\lambda/\Delta P$ and $\Delta\lambda/\Delta T$ are experimentally confirmed.

The device under test (DUT) was laid on the top of gallium indium eutectic metal which is used to make electrical connect. The substrate temperature was controlled by thermoelectric cooler (TEC). The measured wavelength shift as a function of temperature for all devices was 0.75 Å/° C. The wavelength shifts as a function of net dissipated power were 0.59, 0.54, 0.5, 0.43, 0.36 Å/mW, respectively, corresponding to 250, 200, 150, 100, 10 μm thick VCSELs as indicated in FIG. 9. The thermal resistances for 250, 200, 150, 100, 10 μm thick VCSELs were measured to be 772, 710, 657, 572, 478 ° C./W, respectively. Note that the thickness of the 10-μm thick VCSEL has an exclusive advantage of heat management due to the reduction of the thermal resistance shown herein.

As previously discussed, the VCSEL is a major heat source in fully embedded optical interconnects structure. The embedded VCSEL arrays are thermally isolated by surrounding insulators; therefore heat builds up and the operating temperature increases. High operating temperature reduces lifetime of device and laser output power. Reliable operation of the VCSEL is needed through proper heat management. Effective heat removal is a challenging task in embedded structure because the packaging compatibility to PCB manufacturing process has to be considered while providing an effective and simple cooling mechanism.

Figure 10:
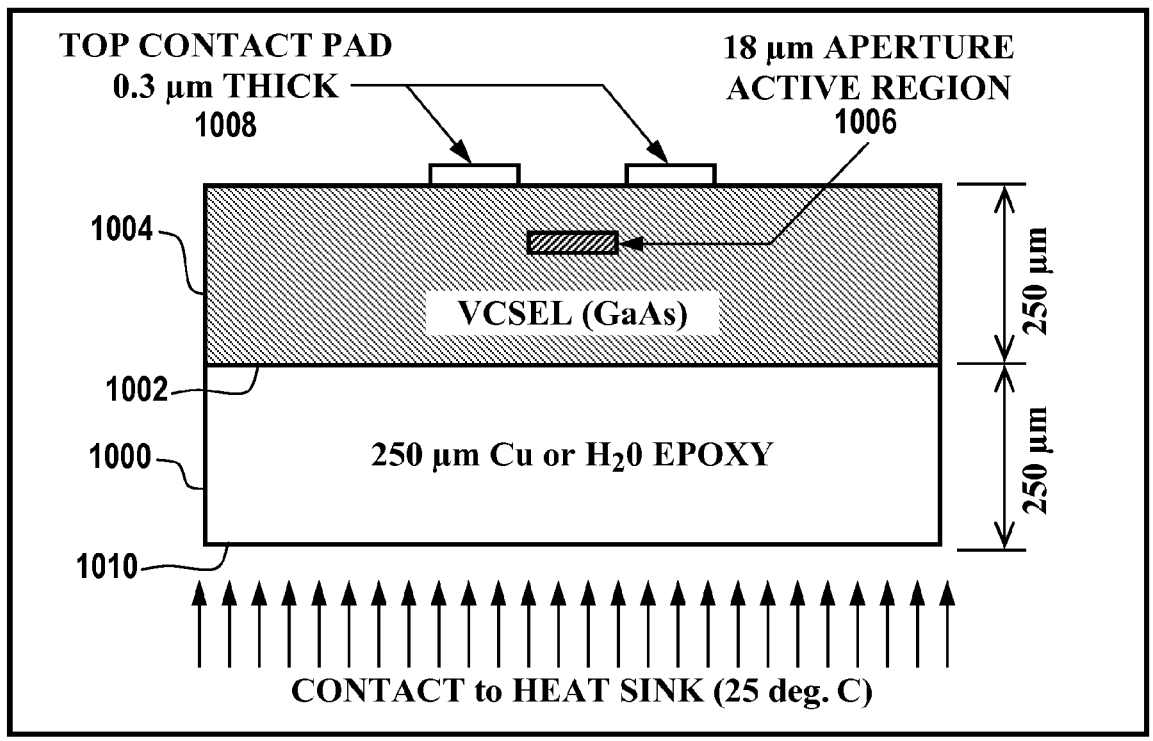
FIG. 10 is a cross sectional diagram of a VCSEL cooling structure of 250 μm thick copper block or thermal paste in accordance with the present invention.
Figure 11:
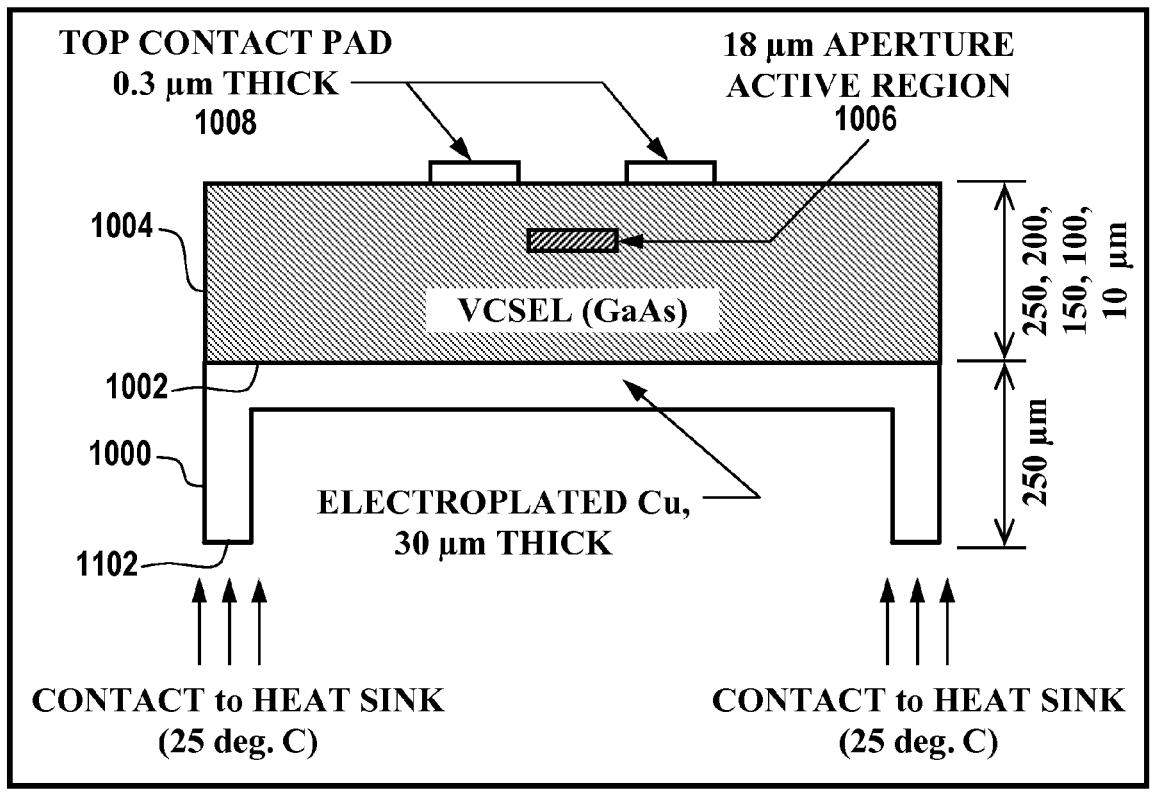
FIG. 11 is a cross sectional diagram of a VCSEL cooling structure of 30 μm thick electroplated copper film in accordance with the present invention.

The present invention provides an effective heat management scheme. Two different cooling structures were compared as shown in FIGS. 10 and 11. FIG. 10 illustrates one embodiment of the present invention using a heat sink 1000 comprising a conductive material of 250 μm thick bulk copper or H2OE epoxy. The heat sink 1000 is deposited on the n-contact pad 1002 of the VCSEL 1004. The VCSEL 1004 also has an aperture 1006 and top contact pads 1008. The bottom surface 1010 of the heat sink 1000 copper block was maintained at 25° C. during the testing. FIG. 11, on the other hand, illustrates another embodiment of the present invention using a heat sink 1100 comprising a conductive material of 30 μm thick electrodeposited copper film. 30 μm thick copper film was chosen as the heat sink 1100 because this is the thickness of copper trace in electrical layer for PCB. The copper film was directly electro-deposited on the n-contact metal pad 1002 of the VCSEL 1004 array during electroplating step. The bottom surface 1102 of the heat sink 1100 copper block was maintained at 25° C. during testing.

The n-contact metal affiliated with the bottom DBR mirror of the VCSEL die was directly electroplated with copper during process without any other thermal conductive paste which has lower conductivity than copper. Usually several tens of micrometer thick copper was deposited in copper contained acid chemical solution during PCB process. It can be used as a very good electrical and thermal passage simultaneously. Thermal resistance of the VCSEL depends on the device structure itself and also packaging structure. Direct bonding of a device using electroplating reduces thermal resistance of device due to the absence of low conductivity bonding epoxy.

The ANSYS program was used to perform 2-D finite element thermal distribution analysis. The thermal conductivities of GaAs, DBR mirror and copper are $4.6\times10^{-5}$ W/μm ° K, $2.3\times10^{-5}$ W/μm K, and $4\times10^{-4}$ W/μm ° K, respectively. Heat is generated due to the Bragg reflector's resistance and imperfect conversion efficiency in active region. However, the heat generated due to the DBR is relatively small compared with active region, therefore this term was ignored in simulation. The heat generation rate in active region (circular shape, diameter of 18 μm) is based on measured value which is 20 mW per VCSEL.

Figure 12:
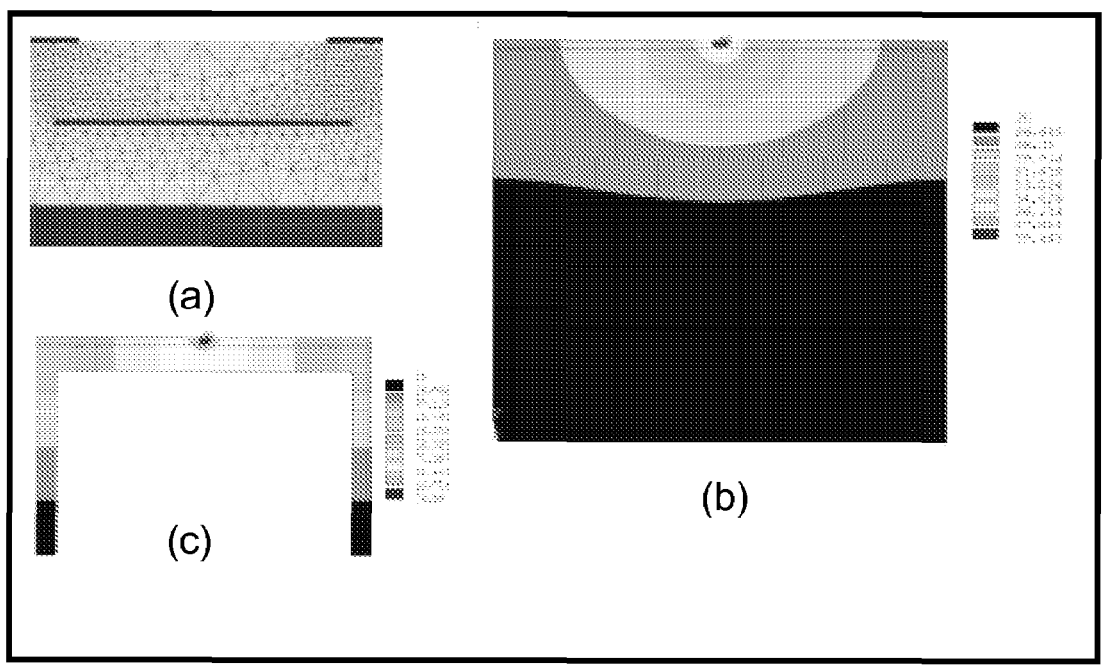
FIG. 12A illustrates a 2D finite element analysis results for a generated mesh in accordance with the present invention.
FIG. 12B illustrates a 2D finite element analysis results for a 250 μm thick copper block, 250 μm thick VCSEL, $\theta_{jc}$=39.4° C. in accordance with the present invention.
FIG. 12C illustrates a 2D finite element analysis for a 250 μm thermal conductive paste, 250 μm thick VCSEL, $\theta_{jc}$=45.9° C. in accordance with the present invention.

The simulation results are shown in FIGS. 12A, 12B and 12C. FIG. 12A is the generated mesh profile. FIG. 12B illustrates a 2D finite element analysis results for a 250 μm thick copper block, 250 μm thick VCSEL, $\theta_{jc}$=39.4° C. FIG. 12C illustrates a 2D finite element analysis for a 250 μm thermal conductive paste, 250 μm thick VCSEL, $\theta_{jc}$=45.9° C. For 250 μm thick copper heat sink block, the temperature at active region reached 39.4° C. corresponding to thermal resistance of 722° K/W (FIG. 12B). For the case of 30 μm thick electrodeposited copper film heat sink, junction temperature reached 34.58° C. as in FIG. 12C corresponding to thermal resistance of 455° K/W. The higher junction temperature reduces quantum efficiency and causes catastrophic failure of the device. Despite of lower thermal resistance of 250 μm thick copper heat sink block, this can not be used in fully embedded structure due to difficulty of realization.

Figure 13:
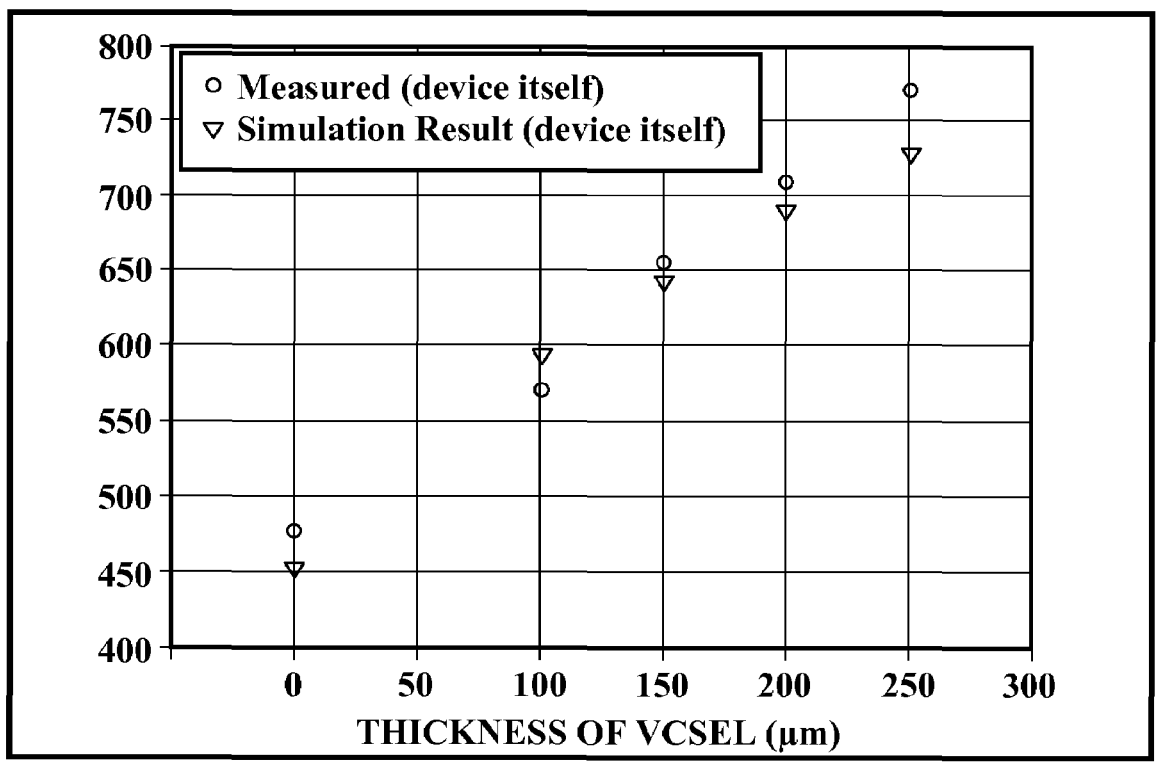
FIG. 13 depicts measured device thermal resistances as a function of device thickness in accordance with the present invention.
Figure 14:
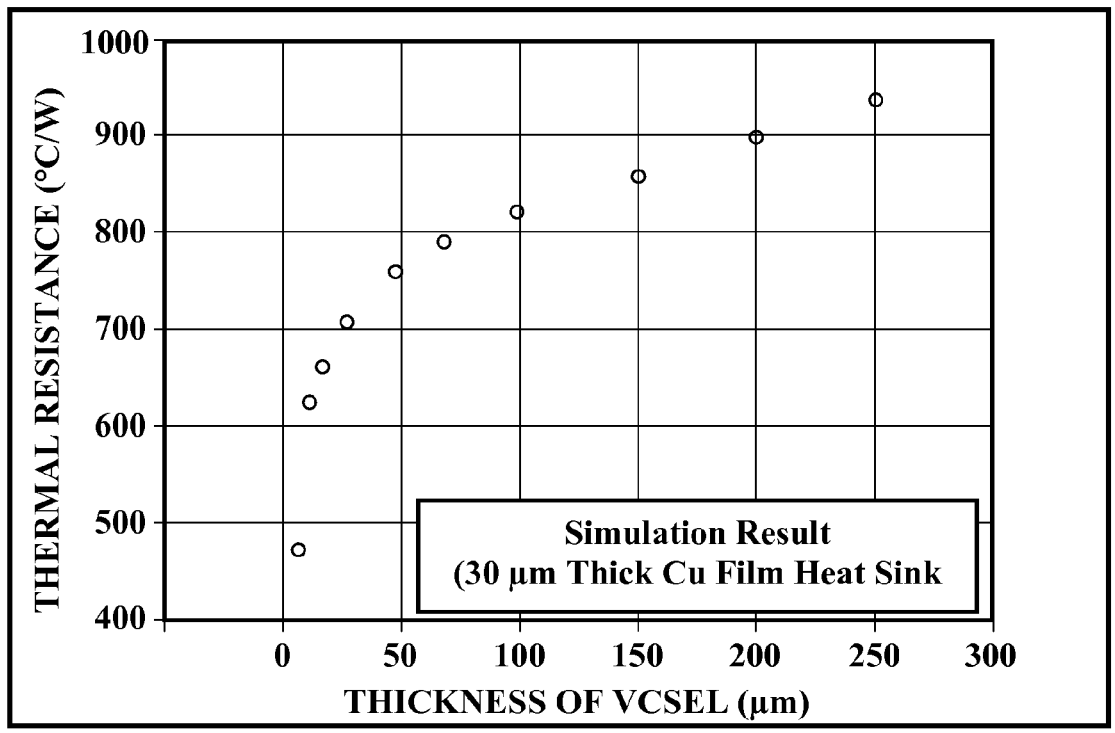
FIG. 14 depicts calculated thermal resistances as a function of device thickness for buried VCSEL with 30 μm thick electroplated Cu film heat sink in accordance with the present invention.

The measured and calculated thermal resistances of the devices are summarized in FIGS. 13 and 14. As shown in FIG. 13, the calculated thermal resistances of devices are well matched with measured results. According to this result, the simulation model and process were properly carried out. FIG. 14 shows theoretically determined thermal resistances for various thick VCSELs. For 30 μm thick electroplated copper film, the junction temperatures were theoretically determined to be 43.8, 43, 42.2, 41.5, 40.2 and 34.6° C. for 250, 200, 150, 100, 50 and 10 µm thick VCSEL, respectively. The substrate removed VCSEL having a total thickness of 10 µm shows superior optical and thermal characteristics. The maximum allowable device thickness to meet the requirement of reliable operation in the fully embedded integration can be determined.

Various fabrication methods for the present invention will now be described in more detail with respect to a flexible optical waveguide film with integrated optoelectronic devices (VCSEL and PIN photodiode arrays) for fully embedded board level optical interconnects. The optical waveguide circuit is fabricated with 45° micro-mirror couplers (reflective elements) on a thin flexible polymeric substrate (channel waveguide structure) by soft molding. The 45° couplers are fabricated by cutting waveguide with microtome blade. The waveguide core material is SU-8 photoresist and the cladding is Cycloolefin copolymer (COC). A thin VCSEL and PIN photodiode array are directly integrated on the waveguide film. The measured propagation loss of a waveguide in accordance with this embodiment of the present invention is approximately 0.6 dB/cm at 850 nm.

The 45° waveguide mirror coupler (reflective element) is a very critical component in optical interconnection applications, especially in planarized lightwave circuits (PLC). The mirror can be incorporated with a vertical optical via to enable 3D optical interconnects and couples light to the waveguide. The 45° waveguide mirror is insensitive to the wavelength of light and efficiently couples optical signals from vertical cavity surface emitting lasers (VCSELs) to polymer waveguides and then from waveguides to photo-detectors. A very important aspect of manufacturing of such coupler is the tolerance interval of the profile parameters, such as the tooth height, the width and the tilt-angle. The new fabrication method provided by the present invention uses a very sharp blade, such as a microtome blade, to cut the polymer waveguide substrate. A blade sliding down to the waveguide substrate at 45° slope cuts the waveguides at 45°. The process works like a guillotine sliding on a slope. The difference is that the blade of the guillotine falls at the right angle instead of at 45°.

Figure 15A:
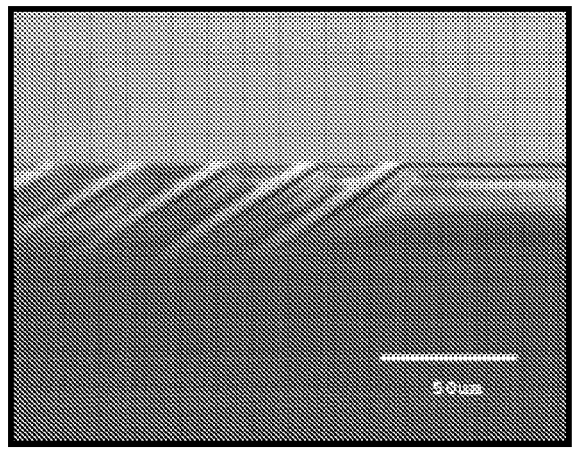
FIG. 15A is a SEM photograph of the waveguide structures with 45° waveguide mirrors and FIG. 15B is an enlarged view of the mirror surface in accordance with the present invention.
Figure 15B:
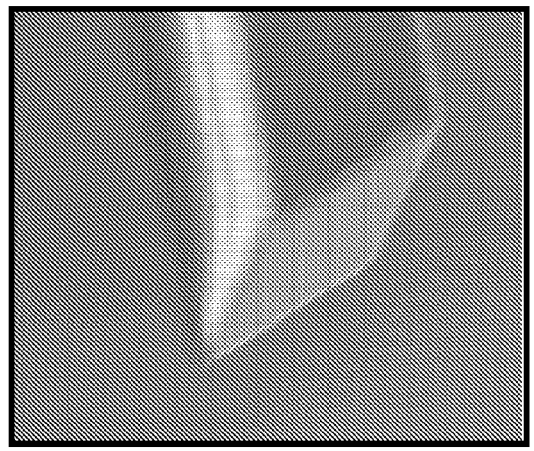

The material of master waveguide structure is SU-8™ (MicroChem) photoresist. The 45° waveguide mirror is fabricated by tilted microtome setup. The master waveguide structure was kept at 120° C. on a hot plate. In general, elevated temperatures soften the polymer, which results in a smoother cutting surface. The blade slides down the substrate at 45° slope. The side-off view and surface of the mirror is shown in FIGS. 15A and 15B. All the waveguides shown in FIG. 15A were cut simultaneously by the microtome blade The coupling efficiency is one of the most critical issues in the fully embedded optical interconnects because of the concerns about thermal management and crosstalk. Higher coupling efficiency between waveguide and VCSEL or detector enables the lower power operation of VCSEL. Furthermore, when small aperture VCSEL is used to operate at a high speed, for example, 3 µm aperture for 10 GHz operation, the coupling efficiency is paramount concern because of the large spatial divergence of VCSEL's light. A large aperture selectively oxidized VCSEL operates in multiple transverse modes due to the strong index confinement created by oxide layer with low refractive index. Real spatial distribution of the VCSEL is not the same as a Gaussian profile; however, it can be considered as a Gaussian profile by ignoring small discrepancies. This assumption results in a simple calculation. Another assumption is that light within acceptance angle of the waveguide are totally coupled into the waveguide. There are about 10 supporting modes in the 50 µm square waveguide with Δn=0.01. For an exact calculation, all the modes are considered, but the number of modes is quite large. It can be treated as geometrical optics. The coupling efficiency, η can be calculated by the ratio of coupled power to total laser power.

$$\eta = \frac{\int_{-r_c}^{r_c} |E(r,z)|^2 dr}{\int_0^\infty |E(r,0)|^2 dr} = \left(\frac{\omega_0}{\omega(z)}\right)^2 \int_{-r_c}^{r_c} |E(r,z)|^2 dr$$

where, $r_c$ is the maximum radius at the mirror facet which correspond to the acceptance angle of the waveguide.

The coupling efficiencies between VCSEL and square (50 µm×50 µm) waveguide with Δn=0.01 (refractive index difference between core and cladding) were calculated as a function of angular deviation from 45°. The substrate thickness (bottom cladding) and the aperture of the VCSEL are 127 µm and 12 µm, respectively. The coupling efficiencies between VCSEL and square (50 µm×50 µm) waveguide with Δn=0.01 (refractive index difference between core and cladding) are calculated as a function of angular deviation from 45°. The substrate thickness (bottom cladding) and the aperture of the VCSEL are 127 µm and 12 µm, respectively.

Figure 16:
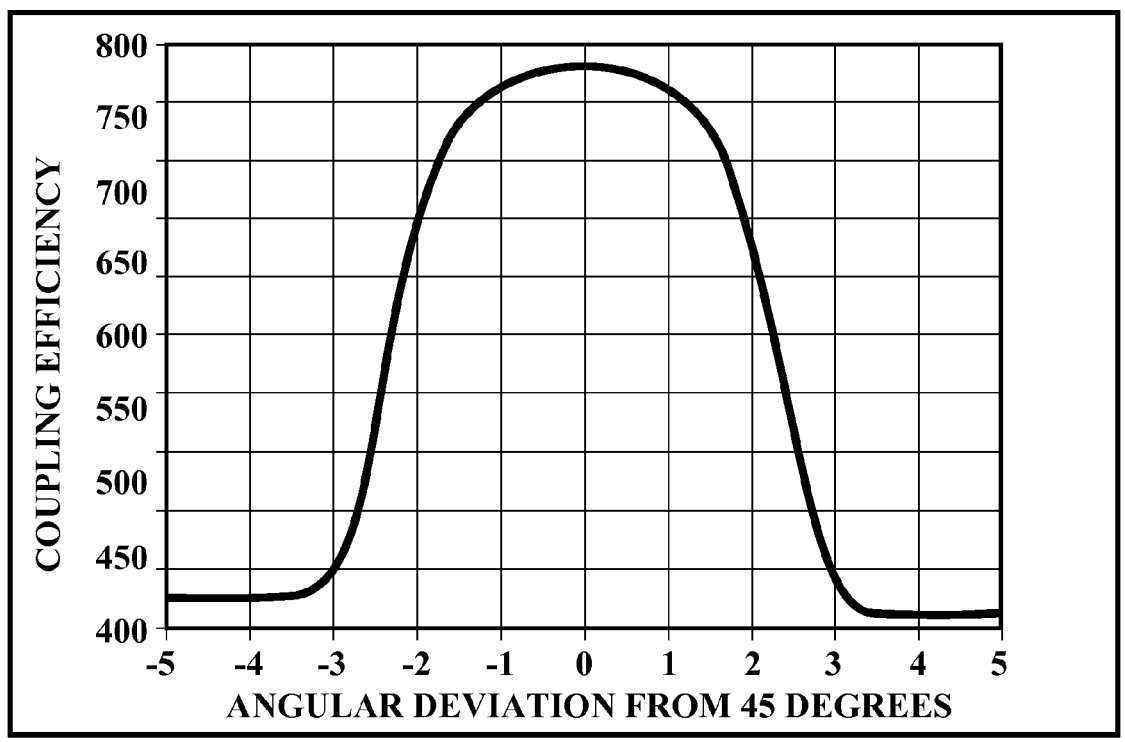
FIG. 16 is a graph of coupling efficiencies as a function of angular deviation from 45° for 127 μm thick substrate with 12 μm aperture VCSEL in accordance with the present invention.

FIG. 16 shows the intensity distributions of laser light at the mirror surface, and the coupling efficiencies as a function of angular deviation from 45° for 127 µm thick substrate, 50×50 µm waveguide, and VCSEL with 12 µm aperture. The facet of 45° mirror is coated with the aluminum to ensure the reflection because TIR (total internal reflection) does not occur due to the top cladding layer. The reflectance of the aluminum is about 92%. In this scheme all laser light falls within the mirror. The coupling efficiency is 92%, which means nearly 100% of the light is coupled into the waveguide excluding the reflectance due to aluminum. The coupling efficiency maintains constant values within 45°±1.5° mirror angle. Therefore, the mirror angle should be kept within 45°±1.5°. The coupling efficiency drops dramatically when the mirror angle is out of the tolerance range (±1.50°).

The present invention uses a molding method to fabrication the optical waveguide because of its dependable process and suitability for large volume production. A solid mold is generally used in various applications such as embossing, optical disk stamping, and Fresnel lens fabrication. The solid mold is made of nickel alloy by electroplating. The fabrication of the solid mold has higher cost and takes a long time. Alternative mold materials include curable resins, such as silicone, and urethane that can be used to reduce the fabrication cost and time. The soft mold has been used in various applications such as rubber stamp, small quantity manufacturing, replication, and micromachining.

Once the master is fabricated, making the mold is simply pouring a mold material over the master and curing. In one example, a silicone elastomer, especially poly (dimethylsiloxane) (PDMS) is chosen to fabricate the mold. The master for the mold is fabricated on a Si-wafer. Multimode waveguide is required for board level interconnection because of the requirement of the lower packaging cost. Alignment of the devices (laser and detector) and the waveguide is easer when the core size of the waveguide is large. The size of the multimode waveguide is 50 µm×50 µm. The process is the same as standard photo-lithography. The Piranha bath consists of 2 parts of sulfuric acid (H2SO4) and 1 part of hydrogen peroxide (H2O2). A Si-wafer was cleaned in the Piranha bath. After the cleaning, the wafer is baked at 150° C. to remove adsorbed water just before spin coating.

Figure 17A:
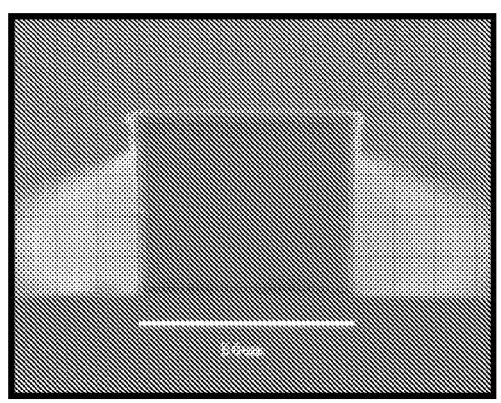
FIGS. 17A and 17B are cross sectional views of SU-8 photoresist pattern for various exposure conditions (Exposure: 300 mJ/cm2) with a UV-34 filter and a UV-34 filter and Index matching oil in accordance with the present invention.
Figure 17B:
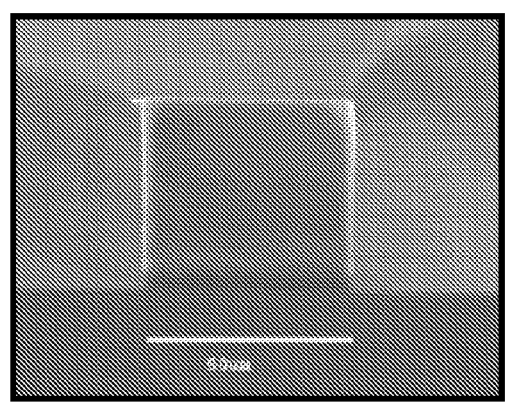

This baking step improves adhesion and removes bubbles in pre-baking step. After baking, photoresist (SU8-2000, MicroChem™) is poured on the wafer and then spin coated at 400 RPM for 5 seconds and then ramped to 1500 RPM for 40 seconds. The wafer is placed on a leveled surface for 5 minutes to improve uniformity. And then, the wafer is moved to leveled hot-plate for a pre-bake. The pre-bake is carried out at 65° C. for 5 minutes and 90° C. for 40 minutes. The photoresist tends to have negative sloped sidewall, which is not good for mold applications. The side wall should have positive slope or at least be vertical for mold application. Exaggerated negative wall is often called as T-topping. The T-topping results from the lateral diffusion of the acid near the surface. UV light shorter than 350 nm is absorbed strongly at the top surface of the photoresist; hence, acid is generated by UV, which diffuses laterally on the top surface. The T-topping can be removed by filtering out short wavelength below 350 nm. Nearly vertical side walls, as shown in FIG. 17A, are made using short wavelength cut filter (UV-34, Hoya). However, there is still a beaked shaped feature between side walls and top surface. A beaked shape results from the diffraction at the interface between the mask and the photoresist, and it can be eliminated by filling index matching oil (glycerol) into the gap. The ethylene glycol was used to fill the air gap in this experiment instead of using glycerol. As shown in FIG. 17B, the beak was completely removed.

Figure 18:
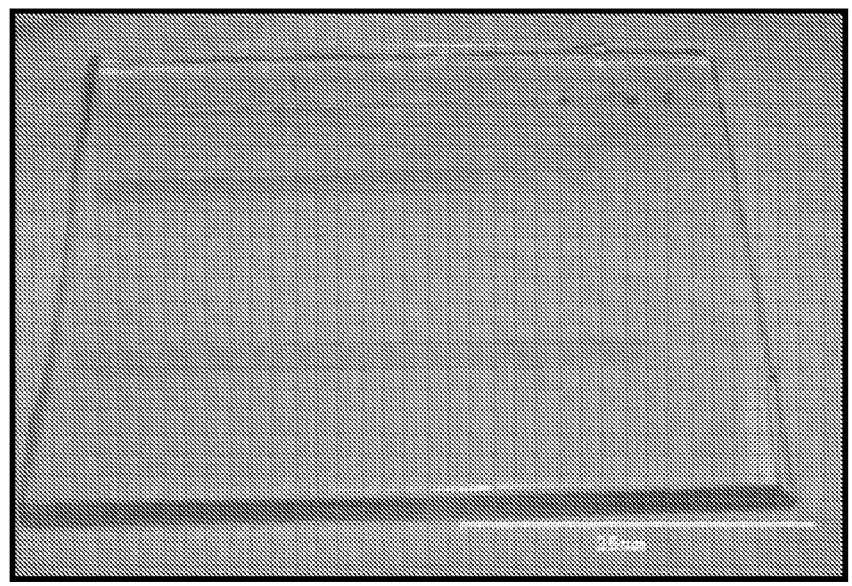
FIG. 18 is a photograph of a PDMS Waveguide mold in accordance with the present invention.

A PDMS mold in accordance with the present invention is shown in FIG. 18. The mold material is PDMS (Sylgard 184, Dow Corning). Prepolymer and a curing agent are mixed at 1:10 ratio. Air bubbles trapped in PDMS are removed in a vacuum chamber. After removing air bubbles, the PDMS is poured on the master and cured at 90° C. in vacuum chamber for 10 hours. Surface relief structures are transferred from master to the mold.

The fully embedded board level optical interconnection requires a thin flexible optical layer. Current electroplating technology can easily plate a through-hole or a via having an aspect ratio of 1 in production line and can plate a hole having an aspect ratio of 3. The size of a typical electrical pad on the device is about 100 μm. These are main reasons for the thickness limit of substrate film. The thin and flexible optical waveguide layer is fabricated by compression molding technique using soft mold. A 127 μm thick optically transparent film (Topas™ 5013) is used as a substrate of the waveguide circuit.

Figure 19:
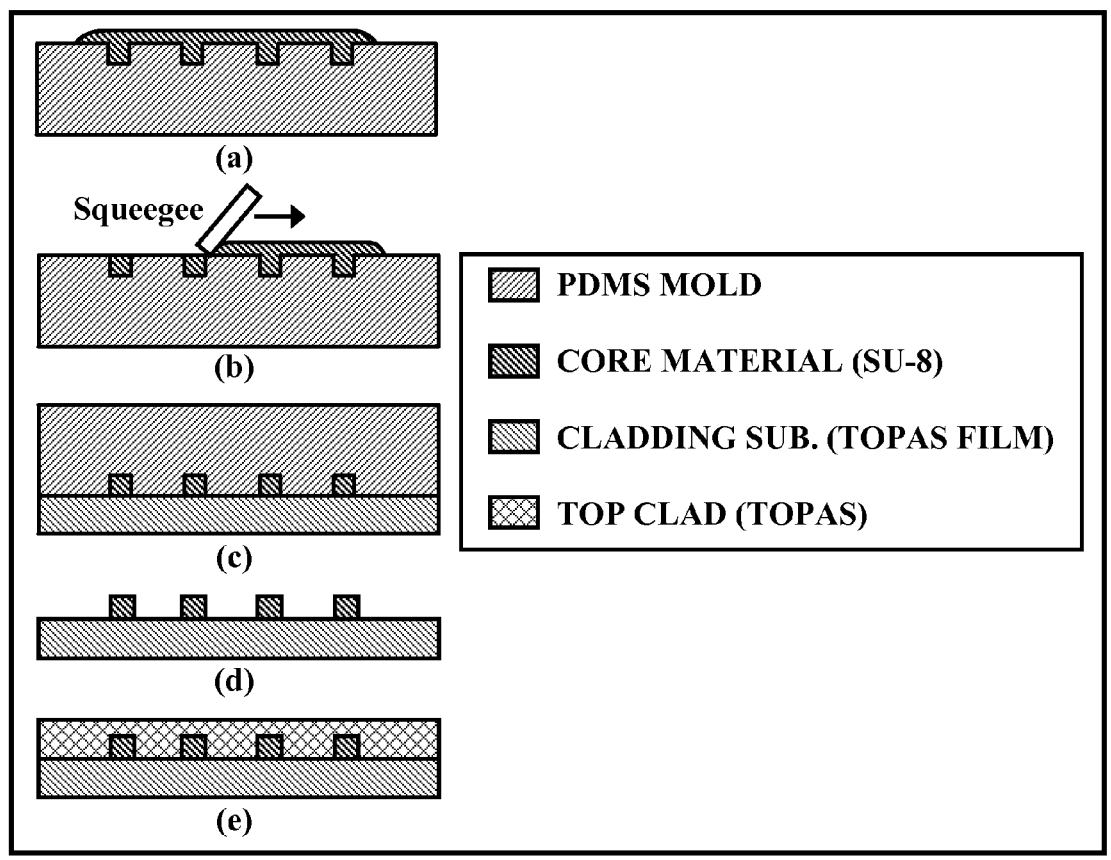
FIG. 19 illustrates a flexible optical waveguide film fabrication process flow in accordance with the present invention.

The fabrication steps for the waveguide structure in accordance with the present invention are fairly straightforward as illustrated in FIG. 19. The core material (SU-8) is poured on the heated PDMS, which is kept at 50° C., in step (a). The heated PDMS mold suppresses bubble generation during molding process. The excess SU-8 is then scraped out using squeegee made of PDMS in step (b). A Topas film is then applied on the top of the PDMS mold filled with SU-8. The mold and the Topas film are inserted into the press machine and pressure is applied for 30 minutes while the plunge plate is held at 90° C. in step (c). The cooling down procedure is performed wherein the mold pressure decreased gradually due to the thermal contraction. The core material (SU-8) is transferred to the substrate film in step (d). Next, the substrate film without the top cladding is exposed to UV to cross-link the SU-8. Once the film is exposed, it becomes chemically and thermally stable. Aluminum is then deposited on the mirror facets in a vacuum chamber to make the mirror. Finally, top cladding material (Topas) is coated on the film in step (e).

Figure 20:
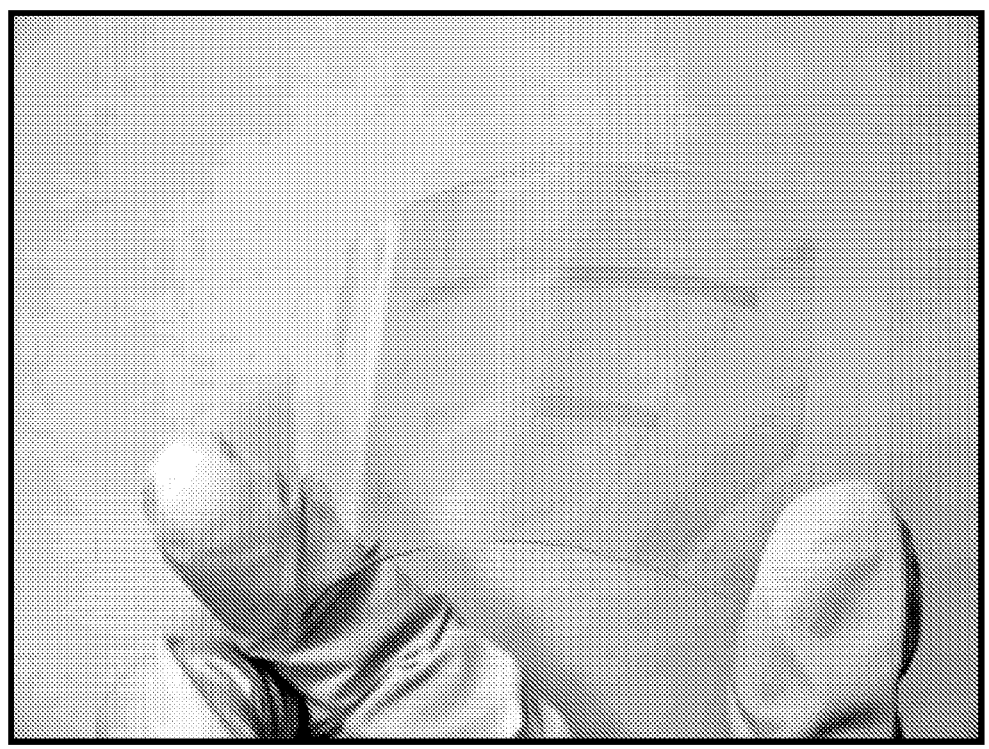
FIG. 20 is a photograph of a fabricated flexible optical waveguide film in accordance with the present invention.
Figure 21:
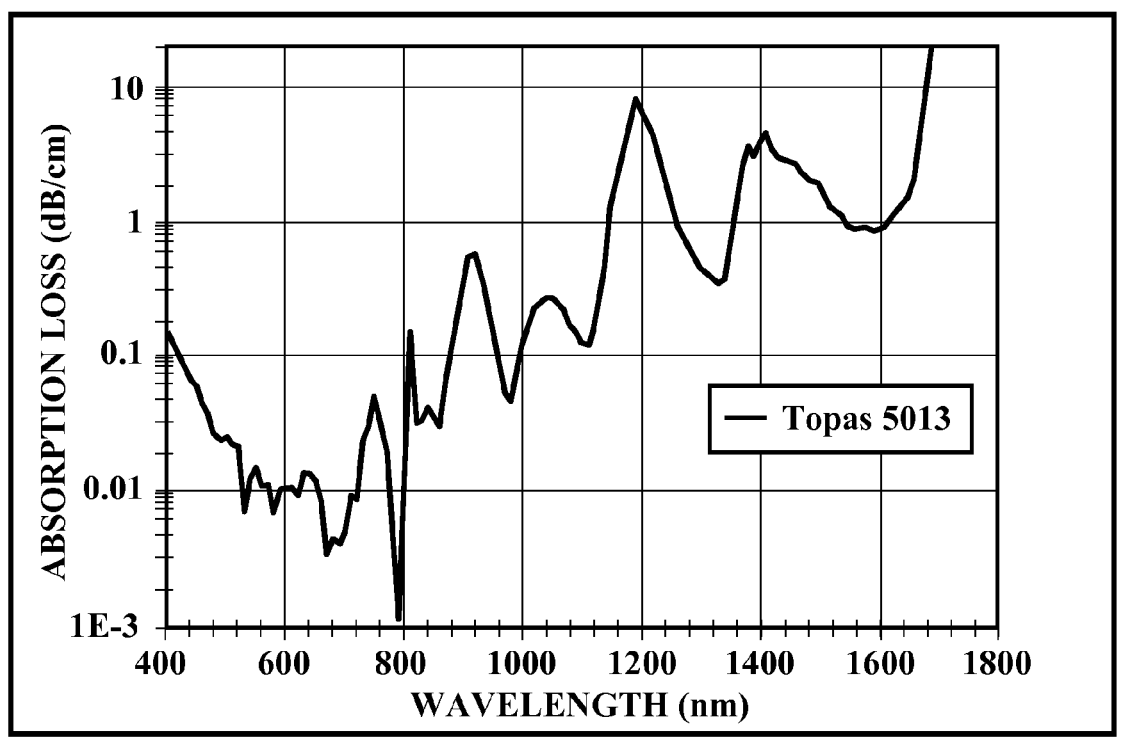
FIG. 21 is a graph of extracted absorption loss of the Topas™ 5013 as a function of wavelength in accordance with the present invention.
Figure 22:
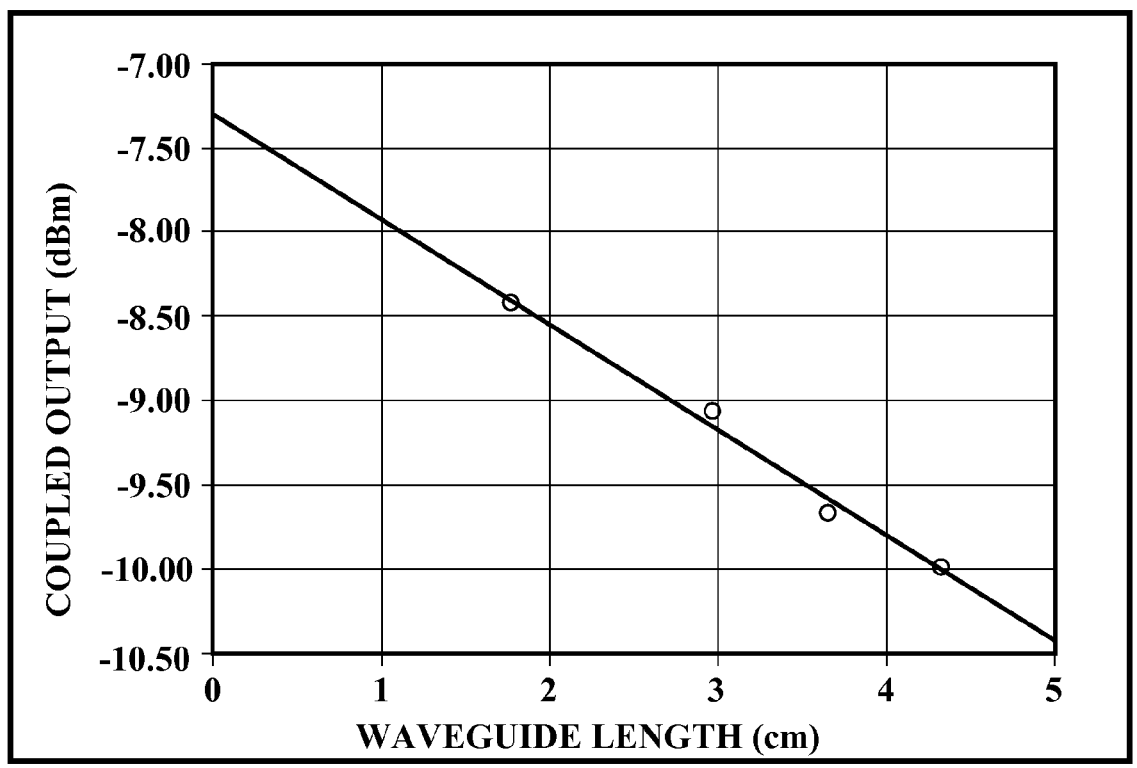
FIG. 22 is a graph of coupled out power as a function of waveguide length in accordance with the present invention.
Figure 23:
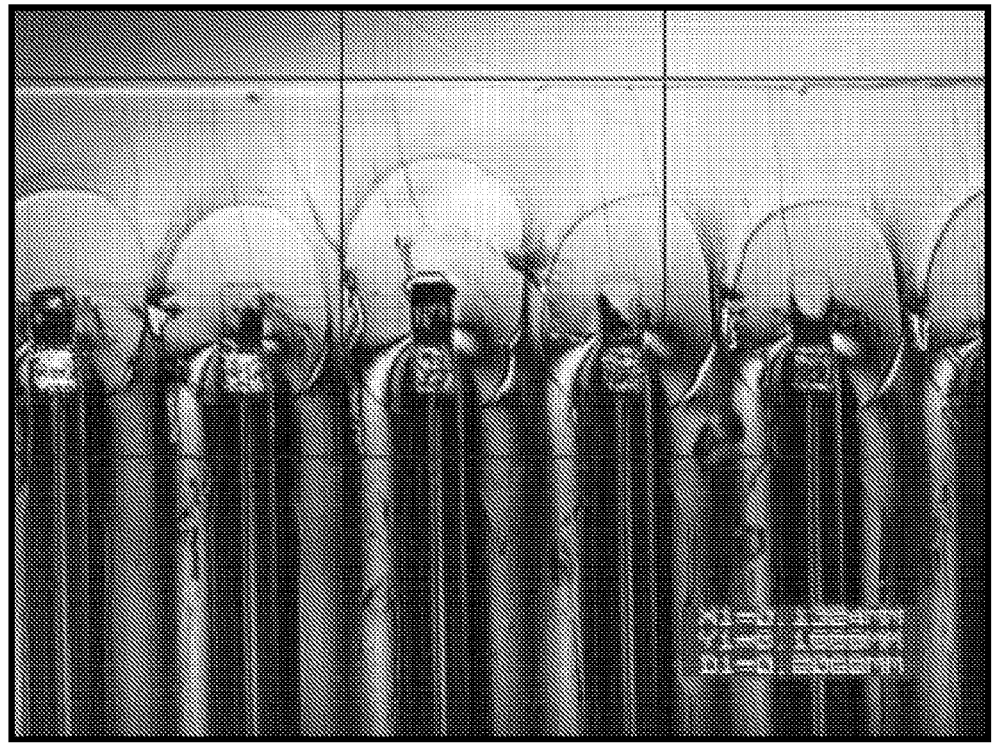
FIG. 23 shows the coupled out beams from 45° waveguide mirrors; in accordance with the present invention.

A fabricated optical interconnection layer in accordance with the present invention is shown in FIG. 20 has micromirror couplers and 12 channel waveguides of 50 mm in length. As shown in FIG. 21, the measured absorption losses of the Topas material (substrate film) are 0.01 dB/cm and 0.03 dB/cm at 630 nm and 850 nm, respectively. These losses are significantly better than previous waveguides (e.g., 6 dB/cm propagation loss at 850 nm for a multi-mode SU-8 waveguide, and 0.22 and 0.48 dB/cm at 1330 and 1550 nm, respectively, using electron beam direct writing). The waveguide propagation loss can be measured using the cut back method. The core dimension is 50×50 μm. Fiber pig-tailed 850 nm laser is used to couple the laser to waveguide. The diameter of fiber is 10 μm, which is similar to VCSEL aperture. Coupled out powers according to the length is shown in FIG. 22. The measured propagation loss is 0.6 dB/cm at 850 nm wavelength. The lights coupled out from 45° mirrors are shown in FIG. 23. A He-Ne laser is lunched at the ends of the waveguides. Lights come out at 45° mirrors which are located at the other ends of waveguides.

Figure 24:
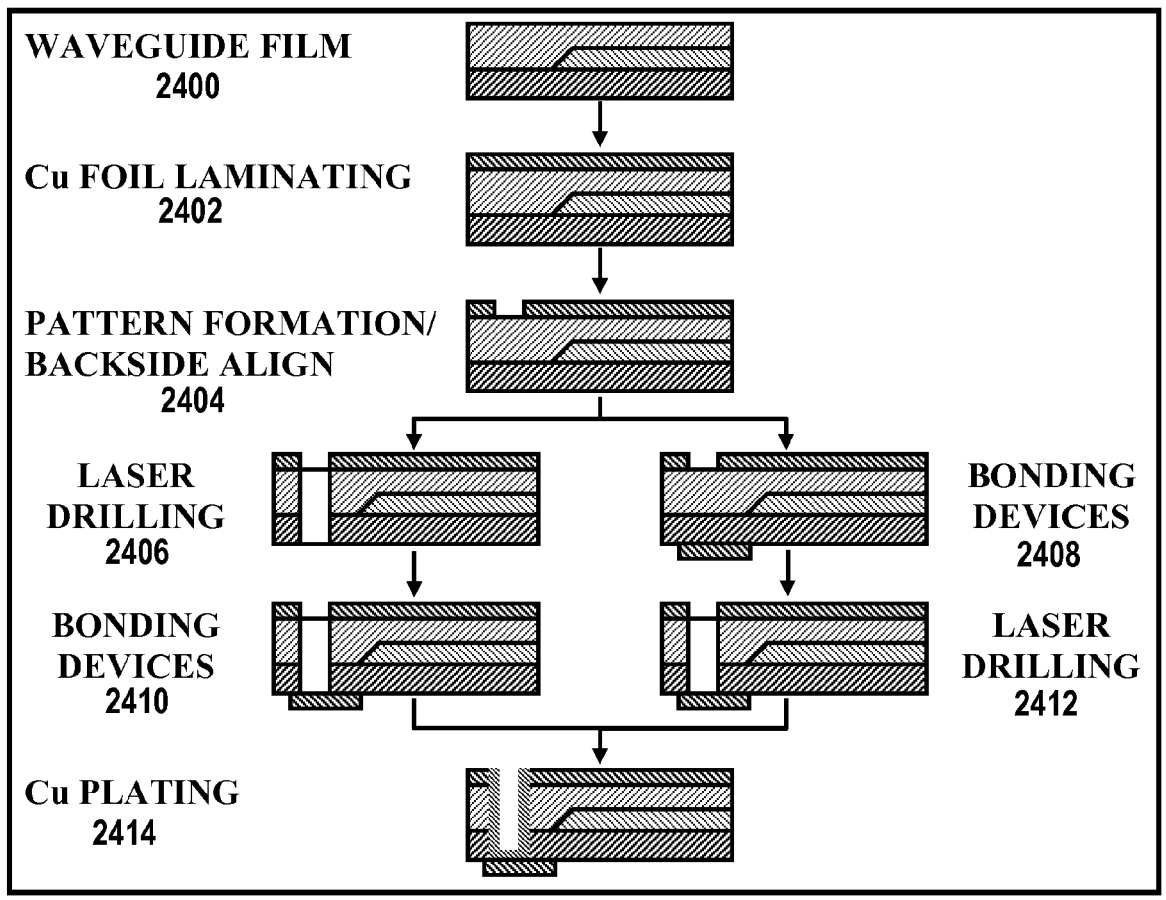
FIG. 24 illustrates a device integration process flow chart in accordance with the present invention.

An example of the device integration process of another embodiment of the present invention will now be discussed in reference to FIG. 24. First, a one mil (25.4 μm) thick copper foil is laminated on the top of the flexible wave guide layer 2400 by applying heat and pressure 2402. This copper foil is patterned to form the top electrical pads for VCSEL and photo-detector. The main reason for the formation of the laminated copper foil is the limitation of electroplating. The thickness of additional electrical layers easily exceeds 1 mm, and the diameter of device pad is 95 μm. This translates to an aspect ratio of 100; therefore, this hole can not be electroplated. The aspect ration of via can be reduced by introducing the copper foil just above the waveguide layer; hence, the micro via can be electroplated. Furthermore, the patterns on the copper foils can be bigger. This means that larger registration error can be allowed during laminating process with electrical layers. The patterns are formed and the back side aligned in 2404.

The next step is either laser drilling 2406 or device bonding on the waveguide layer 2408. There is a possibility of damaging the devices pads during laser micro-via drilling 2412 if the drilling occurs after the device bonding 2408. If damage is likely to occur, the device bonding step 2410 follows drilling 2406. The bonding of devices is performed using an aligner, which typically has two holders; one for mask and the other for substrate. The flexible waveguide film is temporally bonded to a clear glass plate using water and placed on a mask holder. The device to be integrated is put on the substrate holder. A small amount of UV curable adhesive is applied on the top of the device. When the device and waveguide micromirror coupler are aligned, they were exposed with UV to cure the adhesive. The bonding of device to waveguide film can be accomplished by melt bonding without using UV curable adhesive. When alignment is completed, device is heated just above the melting temperature of waveguide film for a short period and the device is bonded to the waveguide film without deforming the micro-vias.

The 30 μm thick, directly electroplated, copper film on the back side of VCSEL array 2414 is an excellent heat sink that does not sacrifice the use of easy packaging. Since extremely thin VCSELs are difficult to handle, 50 μm is the maximum thickness for a reliable operation in a fully embedded structure that can be handled by current automated pick and place machines. Smaller sizes can be used as automated pick and place machines are improved.

Figure 25:
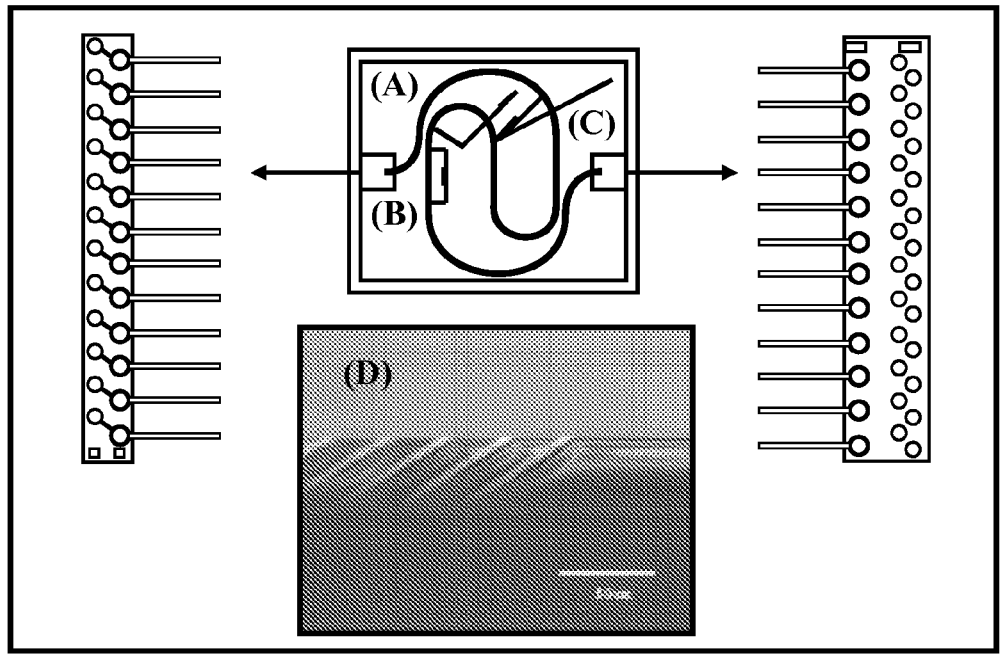
FIG. 25 shows a flexible optical waveguide film, 12-channel VCSEL array, 12-channel PIN photodiode array and 45° micro-mirror couplers in accordance with the present invention.

FIG. 25 shows a schematic diagram of a flexible waveguide film with optoelectronic devices that includes a flexible optical waveguide film, 12-channel VCSEL array, 12-channel PIN photodiode array and 45° micro-mirror couplers in accordance with the present invention. As previously described, the master waveguide structures are formed on a silicon wafer using a standard photo-lithography process. SU8-2050 (MicroChem™) is used as the waveguide structures having 12 channel guides with a square shape cross-section (50 μm×50 μm) and a total length of up to 100 cm. The 45° total internal reflective (TIR) micro-mirrors are adopted to couple light from the VCSELs into the waveguide array, and then to the PIN photodiodes. To get a soft mold with 45° micro-mirror couplers, the master waveguide structure is cut on both ends by a specially designed tool. PDMS (Sylgard 184, Dow Corning) is chosen as a soft mold material. The PDMS is poured on the master waveguide structure and cured. Surface relief waveguide patterns with 45° micro-mirror couplers are transferred from the master waveguide structure to the soft mold.

A flexible waveguide film is fabricated by the soft molding process. The core material (SU-8) is poured on the heated soft mold and then excess SU-8 is scraped out. The soft mold filled with SU-8 is covered with Topas™ 6015 (cyclo-olefin-co-polymer) film, as a bottom cladding layer. The core waveguide structure is transferred from the soft mold to Topas™ 6015 film using a hot-press machine. A flexible waveguide film without the top cladding layer is exposed to UV light to cross-link the SU-8 and the surfaces of the 45° micro-mirrors are deposited with aluminum (Al) to ensure the total internal reflection. Finally, the top cladding layer is spin-coated on the film. Measured propagation loss of the waveguide is below 0.5 dB/cm for both TE and TM modes at 850 nm.

Figure 26:
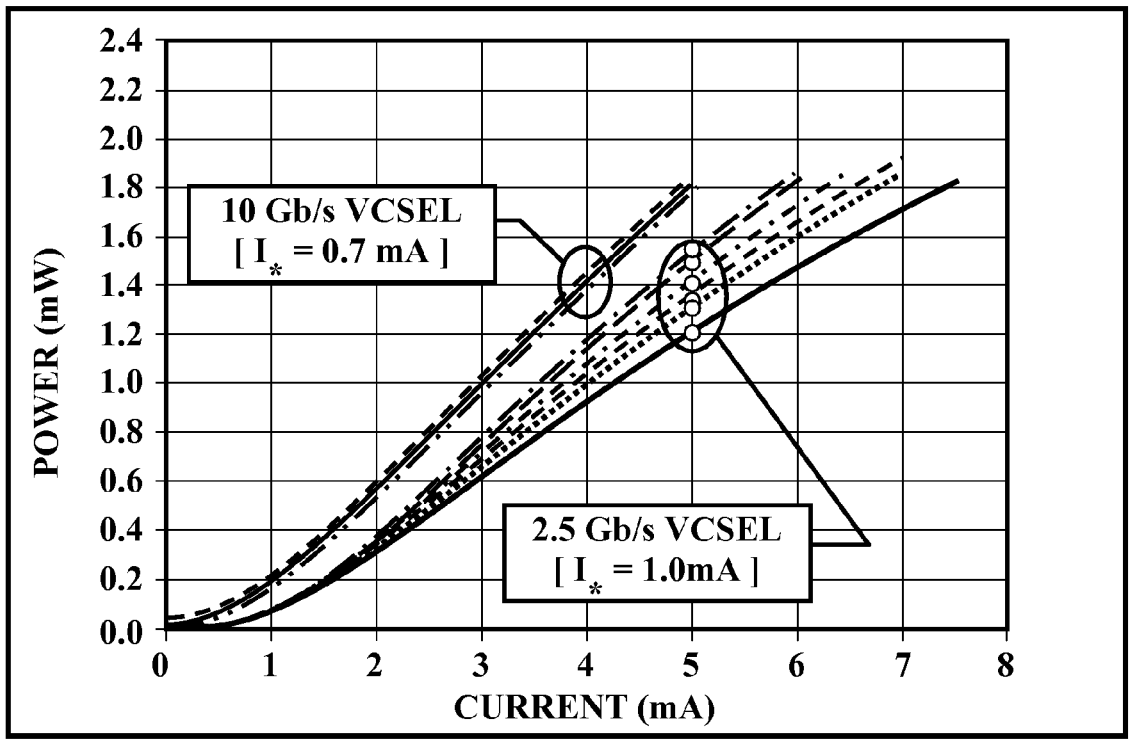
FIG. 26 is a graph showing the L-I characteristics of a 12-channel VCSEL array for the 10 Gb/s and the 2.5 Gb/s in accordance with the present invention.

Two 12-channel, 850 nm VCSEL arrays (2.5 Gb/s and 10 Gb/s) and a PIN photodiode array are used as I/O sources on a flexible polymeric waveguide film. The initial substrate thickness (200 μm) of the VCSEL is reduced to facilitate thermal management of the VCSEL and the fully embedded structure. FIG. 26 shows the L-I characteristics of two 12-channel VCSEL arrays: 10 Gb/s for both to contacts; and 2.5 Gb/s for the top and bottom contacts. Apertures of optoelectronic devices are precisely aligned with I/O windows of the 45° micro-mirror couplers and fixed by a UV curable adhesive. The Electro-optical performance characteristics of the 10 Gb/s 12-channel VCSEL array are as follows.

Figure 27:
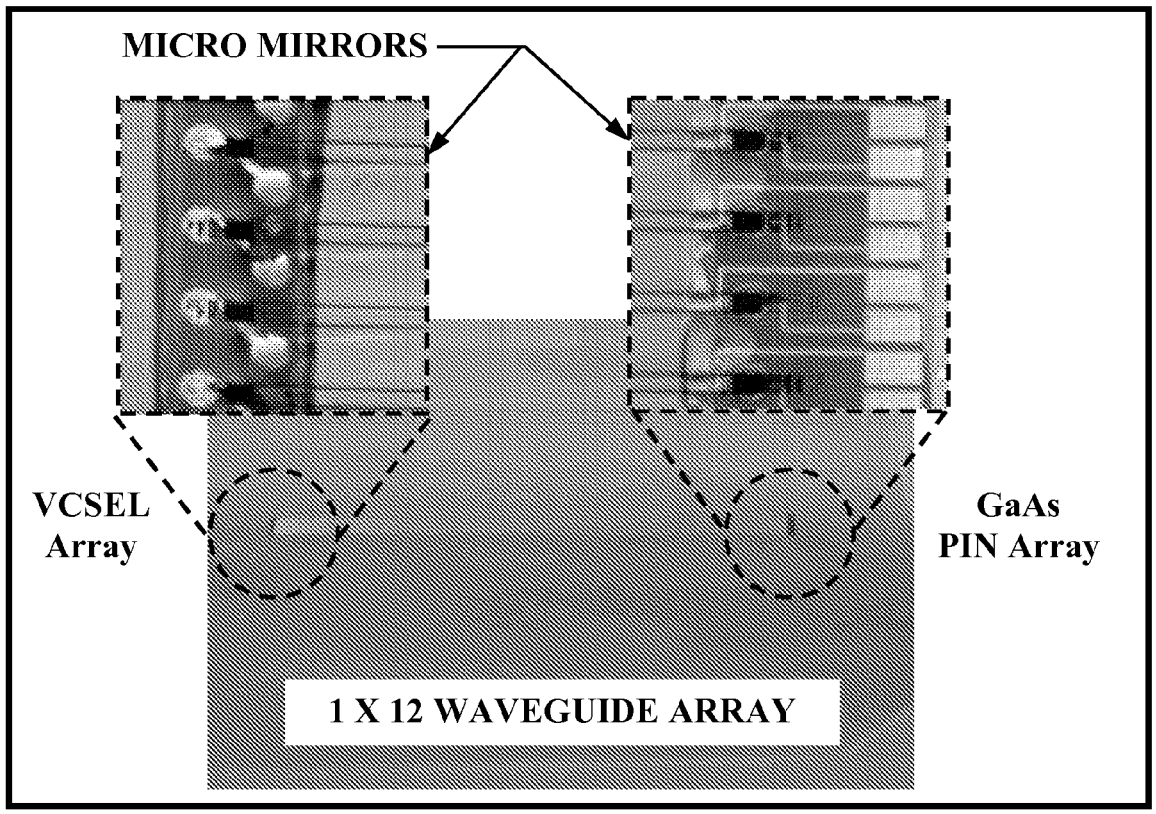
FIG. 27 illustrates an integrated VCSEL and detector arrays on a flexible optical waveguide film in accordance with the present invention.

Threshold Current 0.5~1.5 (mA)
Slope Efficiency 0.35~0.55 (mW/mA)
CentralWavelength 848~860 (nm)
SpectralWidth(RMS) 0.45~0.6 (nm)
Forward Voltage (If=5 mA) 1.4~2.0 (V)
Beam Divergence 27~32 (deg)
Reverse Leakage Current 5~20 (pA)
* Conditions: Tsub=25° C., If=2~5 mA FIG. 27 shows an integrated VCSEL and PIN photodiode arrays. Conventional PCB lamination processes are applied to interpose a flexible waveguide film between PCB layers to form the fully embedded structure in Sanmina-SCI.

The present invention thus provides an efficient optoelectronic signal communications system overcoming process incompatibilities previously associated with implementing optical components in high performance electronic systems. While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. For example, the optical signal communications system may be configured to provide a bus structure, comprising joint transmit and receive elements fabricated together at a single position on the waveguide. Further, the principles of the present invention are practicable in a number of process technologies. It is therefore intended that the appended claims encompass any such modifications or embodiments.

What is claimed is:

1. A method for fabricating an optical waveguide circuit comprising the steps of:
   providing a waveguide layer;
   laminating the top of the waveguide layer with a metallic foil;
   patterning the metallic foil to form top electrical pads for one or more electrical-to-optical transmitters;
   forming micro vias and bonding devices on the waveguide layer;
   fabricating the electrical-to-optical transmitter(s) in the micro via(s); and
   creating a heat sink within the micro via(s) for the electrical-to-optical transmitters by electroplating a metallic film on the back side of the electrical-to-optical transmitters.

2. The method as recited in claim 1, wherein the waveguide layer is fabricated using a soft molding process.

3. An optical waveguide circuit fabricated in accordance with the method of claim 1.

4. The method as recited in claim 1, wherein the optical waveguide circuit is disposed within a printed circuit board, a planarized signal communications system or an optoelectronic signal communications system.

5. The method as recited in claim 1, wherein at least a portion of the metallic film extends approximately to an opening of the micro via.

6. The method as recited in claim 5, further comprising the step of thermally coupling a cooling device to the portion of the metallic film that extends approximately to the opening of the micro via.

7. The method as recited in claim 5, wherein the metallic film coats the interior walls of the micro via.

8. The method as recited in claim 5, wherein the metallic film substantially fills the micro via from the bottom of the electrical-to-optical transmitter to approximately an opening of the micro via.

9. The method as recited in claim 1, wherein the metallic film is approximately 30 μm in thickness.

10. The method as recited in claim 1, wherein the metallic film is approximately 10 to 50 μm in thickness.

11. The method as recited in claim 1, wherein the electrical-to-optical transmitter is between 10 and 250 μm in thickness and the metallic film is between 30 and 250 μm in thickness.

12. The method as recited in claim 1, wherein the electrical-to-optical transmitter is between 10 and 250 μm in thickness and the metallic film is between 10 and 490 μm in thickness.

13. The method as recited in claim 1, wherein the electrical-to-optical transmitter comprises a laser, a vertical cavity surface emitting laser, or an edge emitting laser.

14. A method for fabricating an optical waveguide circuit comprising the steps of:
   providing a waveguide layer;
   laminating the top of the waveguide layer with a metallic foil;
   patterning the metallic foil to form top electrical pads for one or more electrical-to-optical transmitters;
   forming one or more micro via(s) and bonding device(s) on the waveguide layer;
   fabricating the electrical-to-optical transmitter(s) within the micro via(s); and creating a heat sink within the micro via(s) for the electrical-to-optical transmitters by electroplating a metallic film on the back side of the electrical-to-optical transmitters such that the metallic film extends approximately to an opening of the micro via(s).

15. The method as recited in claim 14, further comprising the step of thermally coupling a cooling device to the portion of the metallic film extending approximately to the opening of the micro via(s).

16. The method as recited in claim 14, wherein the metallic film is on interior wall of the micro via or substantially fills the micro via from the bottom of the electrical-to-optical transmitter to approximately an opening of the micro via.

17. The method as recited in claim 14, wherein the metallic film is approximately 30 µm in thickness.

18. The method as recited in claim 14, wherein the metallic film is approximately 10 to 50 µm in thickness.

19. The method as recited in claim 14, wherein the electrical-to-optical transmitter is between 10 and 250 µm in thickness and the metallic film is between 30 and 250 µm in thickness.

20. The method as recited in claim 14, wherein the electrical-to-optical transmitter is between 10 and 250 µm in thickness and the metallic film is between 10 and 490 µm in thickness.

* * * * *

UNITED STATES PATENT AND TRADEMARK OFFICE
CERTIFICATE OF CORRECTION

PATENT NO. : 7,457,491 B2  Page 1 of 2
APPLICATION NO. : 11/524576
DATED : November 25, 2008
INVENTOR(S) : Ray T. Chen and Chulchae Choi It is certified that error appears in the above-identified patent and that said Letters Patent is hereby corrected as shown below:

Title Page, item (75) Inventors:
Replace "Chulchae Chol, Austin TX, (US)" with --Chulchae Choi, Austin, TX (US)--

Col. 1, line 62
Replace "lower dielectric constant materials" with --lower dielectric constants--

Col. 9, lines 15-16
Replace "complicated that using" with --complicated than using--

Col. 10, line 25
Replace "approximately is approximately 10" with --approximately 10--

Col. 13, line 54
Replace "complicated that using" with --complicated than using--

Col. 18, line 35
Replace "W/μm K" with --W/μm°K--

Col. 20, line 13
Replace "correspond to the" with --corresponds to the--

Col. 20, line 41
Replace "method to fabrication" with --method to fabricate--

Col. 20, line 62
Replace "waveguide is easer" with --waveguide is easier--

UNITED STATES PATENT AND TRADEMARK OFFICE
CERTIFICATE OF CORRECTION

| | |
|---|---|
| PATENT NO. | : 7,457,491 B2 |
| APPLICATION NO. | : 11/524576 |
| DATED | : November 25, 2008 |
| INVENTOR(S) | : Ray T. Chen and Chulchae Choi |

It is certified that error appears in the above-identified patent and that said Letters Patent is hereby corrected as shown below:

Col. 22, line 30
Replace "aspect ration of via" with --aspect ratio of via--

Signed and Sealed this

Twelfth Day of May, 2009

JOHN DOLL
*Acting Director of the United States Patent and Trademark Office*